United States Patent
Uematsu et al.

(10) Patent No.: US 7,965,572 B2
(45) Date of Patent: Jun. 21, 2011

(54) SEMICONDUCTOR DEVICE AND INFORMATION PROCESSING SYSTEM

(75) Inventors: Yutaka Uematsu, Chiyoda-ku (JP); Tatsuya Saito, Chiyoda-ku (JP); Yoji Nishio, Chuo-ku (JP); Yukitoshi Hirose, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 144 days.

(21) Appl. No.: 12/504,319

(22) Filed: Jul. 16, 2009

(65) Prior Publication Data

US 2010/0013528 A1     Jan. 21, 2010

(30) Foreign Application Priority Data

Jul. 18, 2008  (JP) ................................ 2008-186707

(51) Int. Cl.
*G11C 7/00* (2006.01)
(52) U.S. Cl. ................ 365/222; 365/194; 365/233
(58) Field of Classification Search .................. 365/222, 365/194, 233
See application file for complete search history.

(56) References Cited

U.S. PATENT DOCUMENTS

| 6,252,816 B1 * | 6/2001 | Mullarkey | 365/222 |
| 6,356,485 B1 * | 3/2002 | Proebsting | 365/189.16 |
| 6,496,437 B2 * | 12/2002 | Leung | 365/222 |

FOREIGN PATENT DOCUMENTS

| JP | 06-214881 A | 8/1994 |
| JP | 07-122065 A | 5/1995 |
| JP | 2003-091989 A | 3/2003 |

* cited by examiner

*Primary Examiner* — Son T Dinh
(74) *Attorney, Agent, or Firm* — Sughrue Mion, PLLC

(57) ABSTRACT

A semiconductor device or an information processing system comprises a plurality of circuit units, and a control unit for controlling a start timing of large-current operations executed by the respective circuit units within a predetermined period, where the large-current operation involves a relatively large current which flows in a power supply system, as compared with other operations. The control unit controls the start timing of the large-current operation from one circuit unit to another such that the waveform of a current flowing from the power supply system is shaped into the waveform of a half cycle of a sinusoidal wave when the circuit units execute large-current operations within the predetermined period.

17 Claims, 19 Drawing Sheets

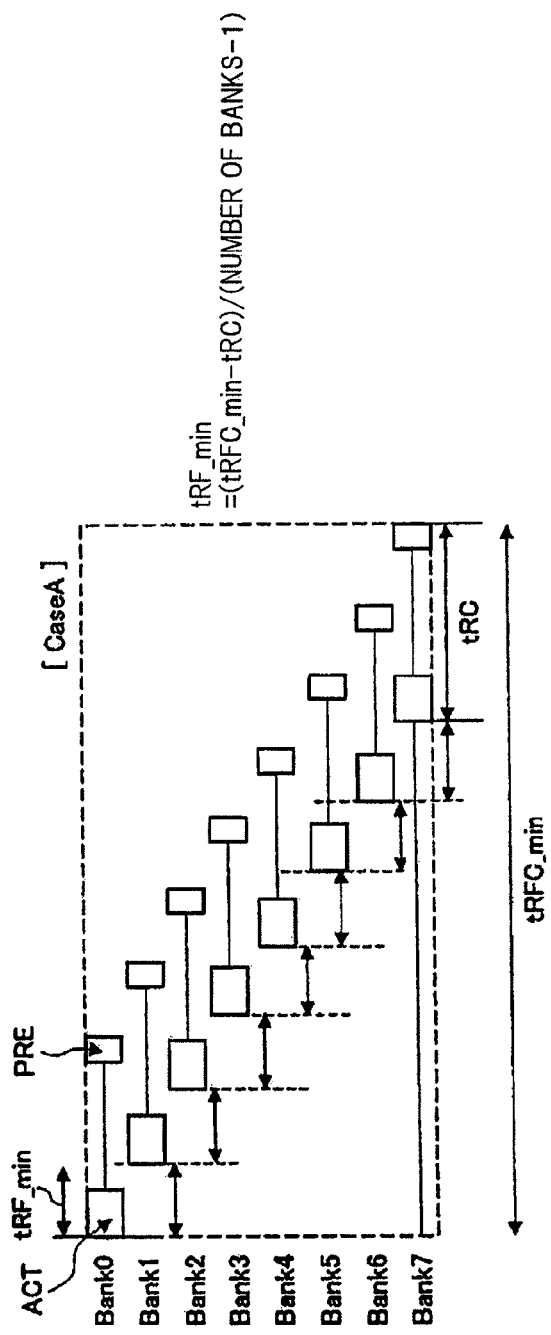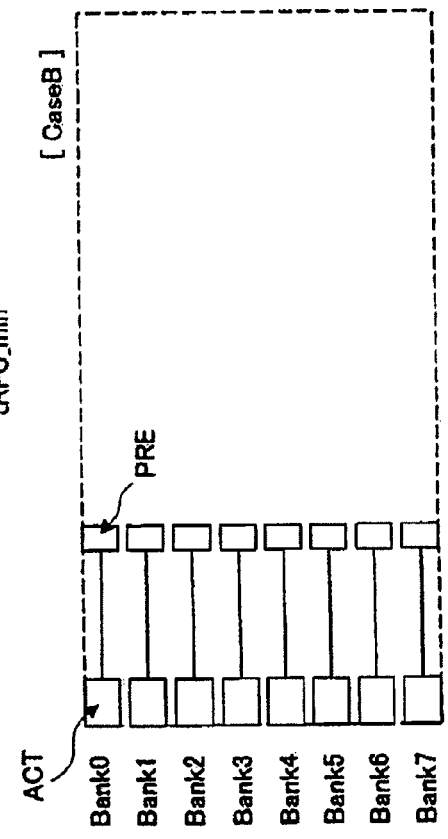
Fig.1A
Fig.1B

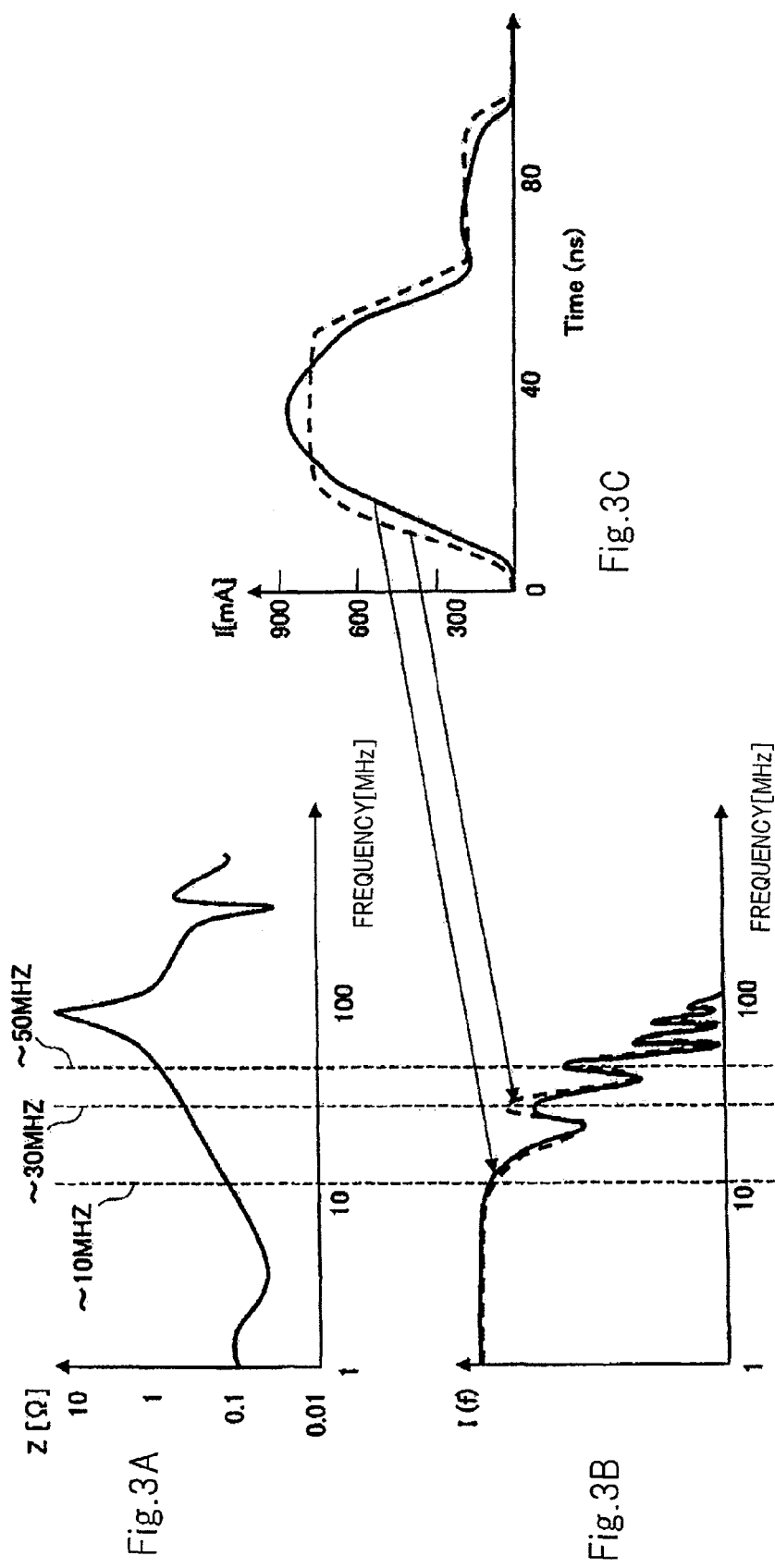

tRF_1=tRF_7 > tRF_2 = tRF_6 > tRF_3=tRF_5 > tRF_4

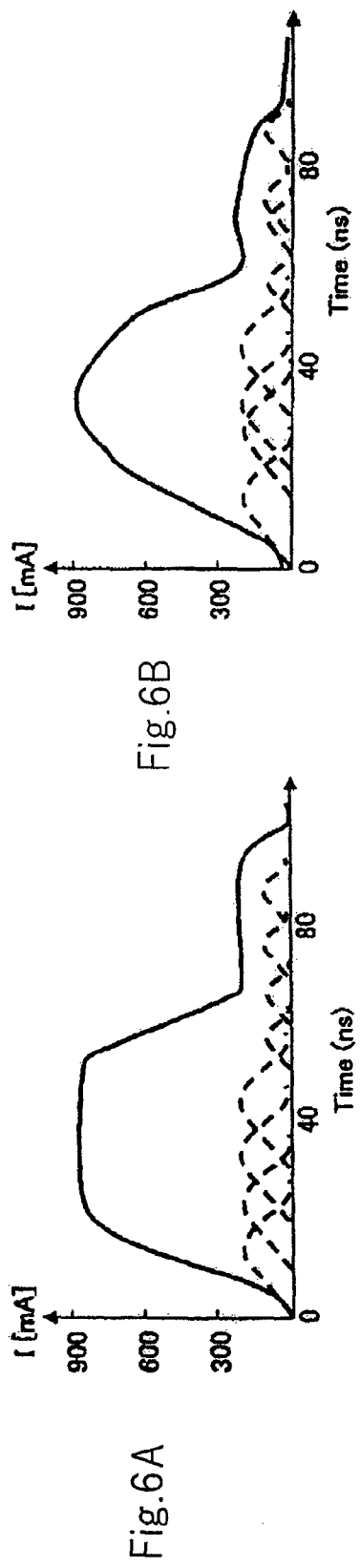
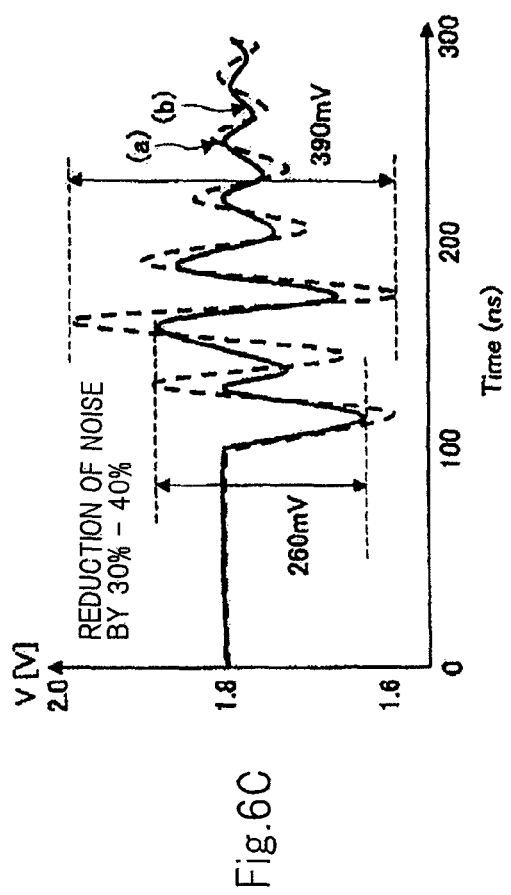
Fig.6A
Fig.6B
Fig.6C

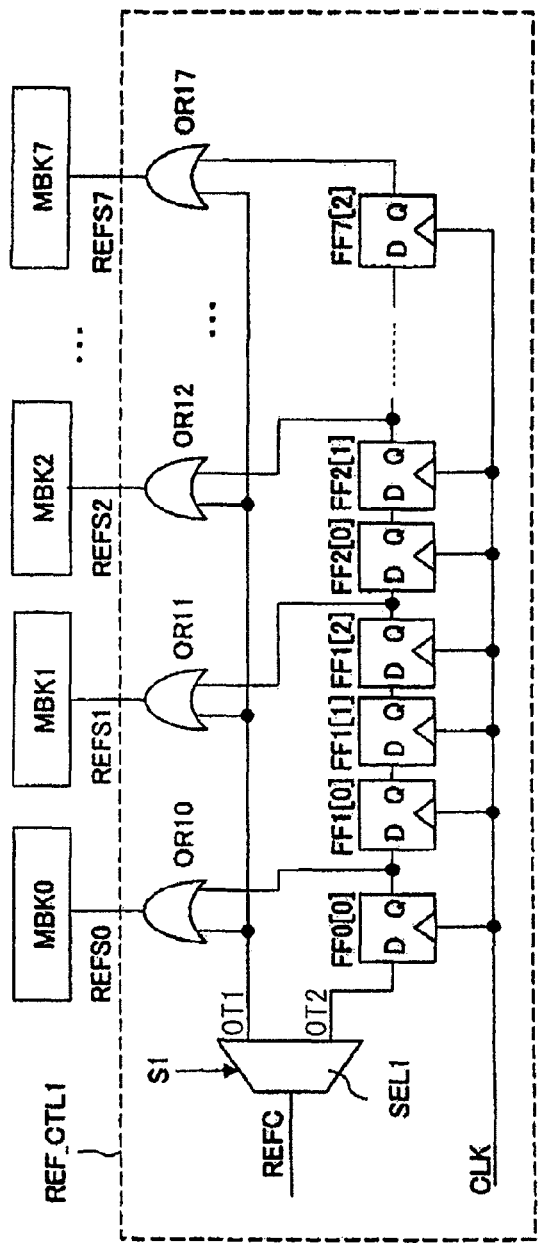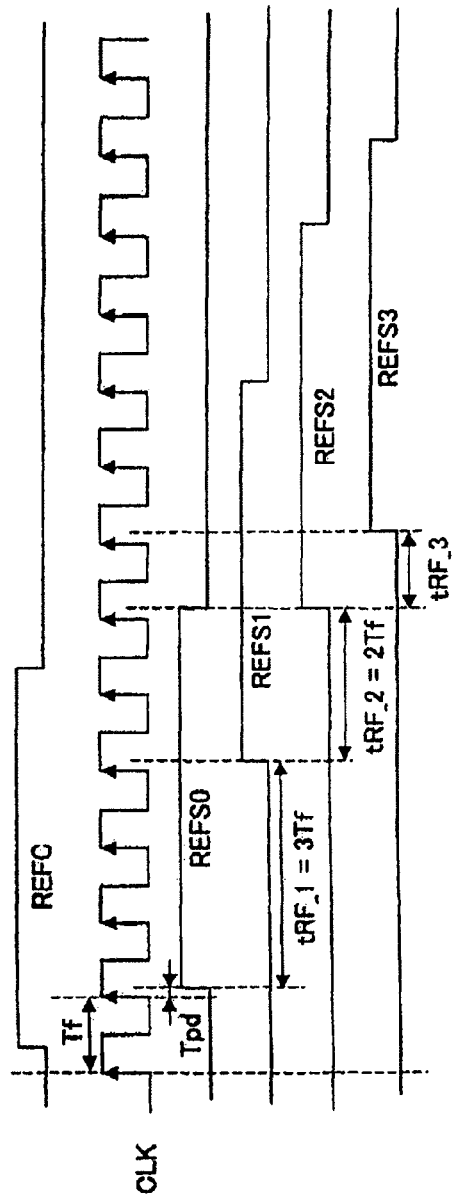
Fig.7A
Fig.7B $tjob\_1 = tjob\_7 > tjob\_2 = tjob\_6 > tjob\_3 = tjob\_5 > tjob\_4$ ton_1=ton_7 > ton_2 = ton_6 > ton_3=ton_5 > ton_4

SEMICONDUCTOR DEVICE AND INFORMATION PROCESSING SYSTEM

BACKGROUND OF THE INVENTION

1. Field of the Invention

The present invention relates to semiconductor devices such as a memory, a processor and the like, and an information processing system which comprises these semiconductor devices.

2. Description of the Related Art

Japanese Patent Application Laid-open No. 06-214881A (hereinafter called Patent Document 1), for example, describes a memory control method for reducing power consumption by shifting a refresh timing from one memory bank to another, in a memory which includes a plurality of memory banks. Patent Document 1 describes that the refresh timing is shifted from one memory bank to another in units of clock signal cycles using a flip-flop circuit for shifting and outputting an input signal in synchronization with a clock signal.

Japanese Patent Application Laid-open No. 07-122065A (hereinafter called Patent Document 2) in turn describes a memory control circuit for reducing power consumption by shifting a refresh timing from one memory bank to another, in a manner similar to the aforementioned Patent Document 1. The memory control circuit described in Patent Document 2 comprises a control register, a counter, and a bank separation circuit for performing logic operations, and the refresh timing is shifted from one memory bank to another in units of fixed cycles of a signal output from the counter. Further, Patent Document 2 describes a control method for refreshing every two banks, for example, while shifting the refresh timing.

Japanese Patent Application Laid-open No. 2003-91989A (hereinafter called Patent Document 3) describes a semiconductor memory device which solely refreshes part of an array selected in accordance with an external instruction when it performs a self-refresh. In the semiconductor memory described in Patent Document 3, as an external instruction is input, a range of address bits to be accessed is manipulated by an internal address generator circuit for generating a refresh address. In the semiconductor memory device described in Patent Document 3, power consumption is reduced by enabling part of the array to be selected, thereby extending the cycle of a distributed refresh operation.

In recent years, a lower supply voltage and a higher speed have been progressively achieved in a variety of semiconductor devices, and noise voltages of a power supply system generated in association with abrupt changes in current have increasingly hindered stable operations of devices. For example, in DDR-SDRAM (Double Data Rate-Synchronous Dynamic Random Access Memory), larger importance has been placed on techniques for reducing noise voltages of a power supply system as newer versions have advanced from DDR to DDR2 and to DDR3.

A power supply system for DRAM can be classified into a core block (VDD) and an I/O block (VDDQ). In these blocks, a refresh operation which involves large current consumption constitutes a principal noise factor in the core block. The refresh operation refers to recharging capacitors for storing data, and DRAM must perform a refresh operation for every predetermined period without fail in order to hold stored data.

The refresh operation is executed, for example, in response to an auto-refresh command (REF command) input from the outside. Alternatively, the refresh operation is executed by generating a REF command at certain time intervals within a DRAM (so-called self-refresh operation). Generally, as a REF command is issued, particular word lines are simultaneously activated within all memory banks of a DRAM. Also, as the REF command is issued, an ACT command (activation of word lines) and a PRE command (deactivation of word lines and precharge of bit lines) are generated within the DRAM, and the ACT command and PRE command are output to all the memory banks. In this event, an address for specifying a particular word line (word line address) is automatically generated by a refresh counter circuit or the like contained in the DRAM.

When particular word lines are simultaneously activated in all the memory banks in this way, a large current instantaneously flows from the power supply system to each memory bank, causing a large noise voltage to occur in the power supply system.

FIGS. 1A and 1B are diagrams showing an exemplary refresh operation in a semiconductor device of a related art. FIG. 2A in turn is a chart showing an exemplary waveform of current from a power supply during a refresh operation shown in FIGS. 1A and 1B, and FIG. 2B is a chart showing an exemplary waveform of voltage from the power supply during the refresh operation shown in FIGS. 1A and 1B.

In the following, a description will be given of why a large noise voltage occurs in the power supply system of the related art semiconductor device, giving, as an example, a semiconductor device (DRAM) which comprises eight memory banks.

First, in a refresh operation shown in FIG. 1B (hereinafter called "Case B"), an ACT command is simultaneously issued to all memory banks (Bank0-Bank7), and after the lapse of a certain time, a PRE command is simultaneously issued to all the memory banks. In this event, as shown in [Case B] of FIG. 2A, a large current flows from the power supply system when the ACT command is issued and when the PRE command is issued. Also, as shown in [Case B] in FIG. 2B, a supply voltage largely fluctuates due to the large current flowing from the power supply system. The fluctuations in the supply voltage appear as a noise voltage which adversely affects the operation of the device.

In the aforementioned Patent Documents 1 and 2, the ACT command is issued at a time point shifted by tRF_min from one memory bank to another, and the PRE command is issued at a time point shifted by tRF_min from one memory bank to another, as shown in FIG. 1A (hereinafter called "Case A"), in order to reduce such noise voltages. Here, period tRFC_min shown in FIG. 1A is a period which must be minimally ensured from the time the ACT command is issued to the first memory bank to the time when the refresh operation ends in the last memory bank, and is generally defined as a specified value. Period tRC in turn is a period which must be minimally ensured from the time the ACT command is issued to a memory bank to the time when the PRE command is issued to the same memory bank, and is generally defined as a specified value as well.

Accordingly, in order to satisfy the foregoing specified values, respectively, tRF_min must be set within a value calculated by the following Equation (1):

$$tRF\_min = (tRFC\_min - tRC)/(\text{Number of Banks} - 1) \qquad (1)$$

With the employment of the refresh operation shown in FIG. 1A, the current which flows from the power supply system in association with the refresh operation is averaged, as shown in [Case A] of FIG. 2A, so that a peak current is largely reduced as compared with [Case B]. Thus, the supply voltage fluctuates less as compared with [Case B], as shown in [Case A] of FIG. 2B, leading to a reduction in noise voltage.

In this regard, since the time required for a refresh operation is generally on the order of 100 ns, it is thought that the power supply system suffers a noise voltage which has a fundamental wave at a frequency in a 10-MHz band during the refresh operation.

Generally, the impedance of a power supply system is mainly comprised of inductance (L) in a band of several tens of MHz (i.e., the higher the frequency, the larger the impedance), and harmonic components of a current flowing from the power supply system (supply current) largely affect the amount of noise voltage as well.

In the techniques described in the aforementioned Patent Documents 1 and 2, since the waveform of the supply current is substantially trapezoidal, as shown in [Case A] of FIG. 2A, the supply current contains large harmonic components. For this reason, when the production of newer semiconductor devices further advances, stable operations of devices are likely to be largely hindered by power supply noise caused by the harmonic components.

SUMMARY OF THE INVENTION

A semiconductor device of the present invention comprises:

a plurality of circuit blocks; and a control circuit for controlling a start timing of a large-current operation performed by each of the plurality of circuit blocks within a predetermined period, the large-current operation involving a relatively large current flowing from a power supply system as compared with other operations, wherein the control circuit controls a start timing for the large-current operation of each circuit block such that the waveform of the current flowing from the power supply system is shaped into a waveform of a half cycle of a sinusoidal wave, when the plurality of circuit blocks execute large-current operations within the predetermined period.

An information processing system of the present invention in turn comprises:

a plurality of semiconductor devices; and a control device for controlling a start timing of a large-current operation performed by each of the plurality of semiconductor devices within a predetermined period, the large-current operation involving a relatively large current flowing from a power supply system as compared with other operations, wherein the control device controls a start timing for the large-current operation of each semiconductor device such that the waveform of the current flowing from the power supply system is shaped into a waveform of a half cycle of a sinusoidal wave, when the plurality of semiconductor devices execute the large-current operations within the predetermined period.

BRIEF DESCRIPTION OF THE DRAWINGS

FIGS. 1A and 1B are diagrams showing an exemplary refresh operation in a semiconductor device of related art;

FIG. 3A is a diagram for describing the principles by which advantages of the present invention are provided, and is a graph showing an exemplary frequency characteristic of impedance in a power supply system;

FIG. 3B is a diagram for describing the principles by which advantages of the present invention are provided, and is a graph showing an exemplary frequency characteristic of a current which flows in the power supply system;

FIG. 3C is a diagram for describing the principles by which advantages of the present invention are provided, and is a waveform chart showing an exemplary waveform of the current which flows in the power supply system;

FIG. 6A is a waveform chart showing an exemplary waveform of a current from a power supply during a refresh operation in a semiconductor device of a related art;

FIG. 6B is a waveform chart showing an exemplary waveform of a current from the power supply during the refresh operation in the semiconductor device shown in FIG. 5;

FIG. 6C is a waveform chart showing exemplary waveforms of voltages in the power supply which correspond to the current waveforms shown in FIGS. 6A and 6B, respectively;

FIG. 7A is a circuit diagram showing an exemplary configuration of a refresh control circuit shown in FIG. 4;

FIG. 7B is a waveform chart showing an exemplary operation of the refresh control circuit shown in FIG. 7A;

DETAILED DESCRIPTION OF THE PREFERRED EMBODIMENT

Figure 2B:
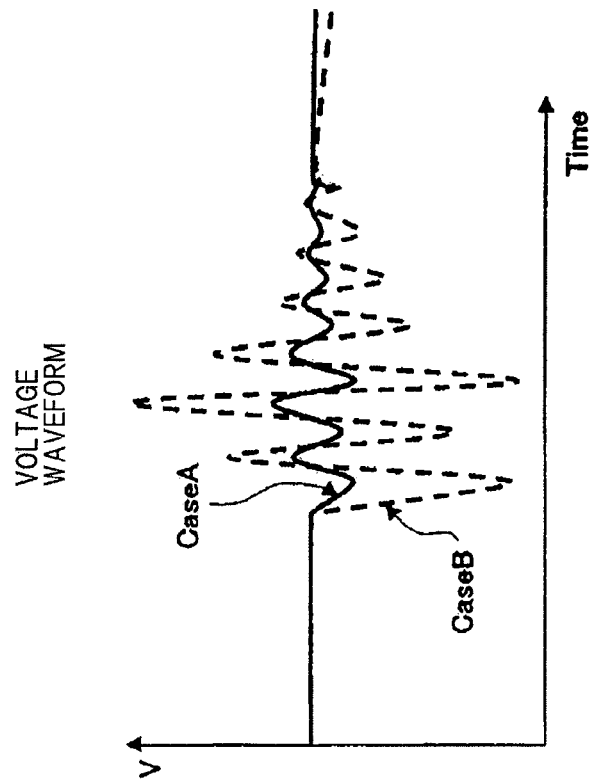
FIG. 2B is a chart showing an exemplary waveform of a voltage from the power supply during the refresh operation shown in FIGS. 1A and 1B.
Figure 2A:
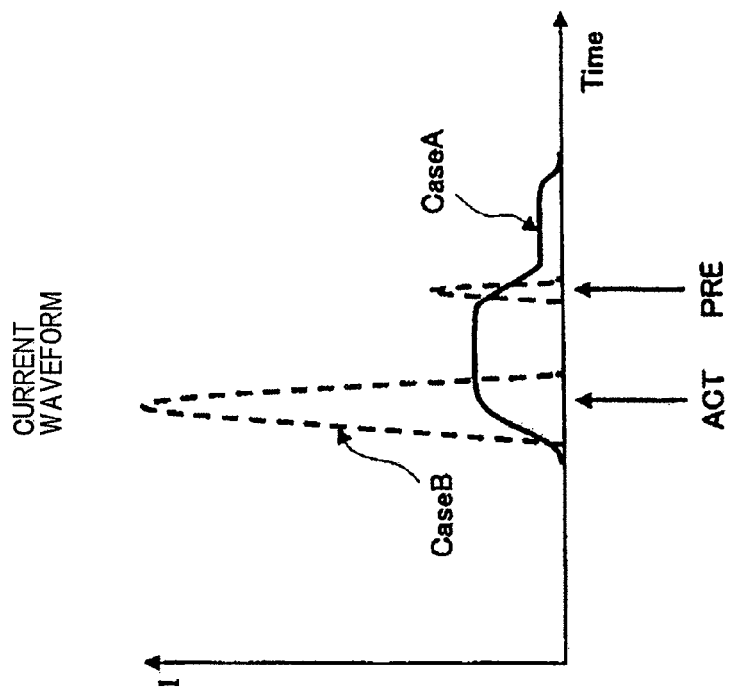
FIG. 2A is a chart showing an exemplary waveform of a current from a power supply during the refresh operation shown in FIGS. 1A and 1B.

In the following, while a separate description, as regards the present invention, will be made of a plurality of sections or a plurality of embodiments into which the present invention is divided for convenience, or as required, these sections or embodiments are not independent of each other, but constitute a relationship in which is an exemplary modification, a detailed description, a supplementary description and the like of part or all of another, unless particularly stated explicitly. Also, in each of the following embodiments, when reference is made to the number of components (including quantity, value, amount, range and the like), the present invention is not limited to the referenced number but may take a number equal to or more than or less than the reference number unless particularly so stated explicitly or obviously limited to a particular number.

Further, in each of the following embodiments, it should be understood that components thereof (including elements, steps and the like) are not necessarily essential unless particularly stated explicitly or unless they are believed to be obviously essential. Likewise, when reference is made to a shape, a positional relationship or the like of a component and the like in each of the following embodiments, those that approximate or are similar to the shape and the like are also included unless particularly stated explicitly or unless they are believed not to be so.

In the following, the present invention will be described with reference to the drawings.

In all drawings used in the following description, the same members are designated the same reference numerals in principle, and repeated descriptions thereon are omitted.

First, the principles of the present invention will be described with reference to FIGS. 3A-3C.

FIG. 3A is a diagram for describing the principles by which advantages of the present invention are provided, and is a graph showing an exemplary frequency characteristic of impedance in a power supply system. FIG. 3B is a diagram for describing the principles by which advantages of the present invention are provided, and is a graph showing an exemplary frequency characteristic of a current which flows in the power supply system. FIG. 3C is a diagram for describing the principles by which advantages of the present invention are provided, and is a waveform chart showing an exemplary waveform of the current which flows in the power supply system.

FIG. 3A shows a profile of impedance of a power supply system in a general semiconductor chip.

As described above, the impedance of a power supply system in a band of several tens of MHz is mainly comprised of inductance of a substrate, an LSI package and the like. Generally, it is difficult to reduce impedance in this frequency band (because an expensive package or the like is required). Also, impedance Z in this frequency band exhibits a characteristic curve which rises to the right (from the impedance of inductance: $Z_L = 2f\pi \cdot L$).

Since a voltage is determined by the product of a current and impedance, it is preferable to reduce a current component in a frequency band in which the impedance becomes larger, in order to reduce the noise voltage in a power supply system.

Specifically, the waveform of a current which flows in a power supply system is preferably in the shape of a half cycle of a sinusoidal wave (hereinafter called the "half-cycle sinusoidal wave"), indicated by a solid line, rather than a substantially trapezoidal shape, as indicated by a broken line in FIG. 3C. When a current flowing from a power supply system is controlled to shape the current into such a half-cycle sinusoidal wave, harmonic components of the current flowing from the power supply system are reduced, as shown in FIG. 3B, so that the noise voltage can be reduced.

First Embodiment

Figure 4B:
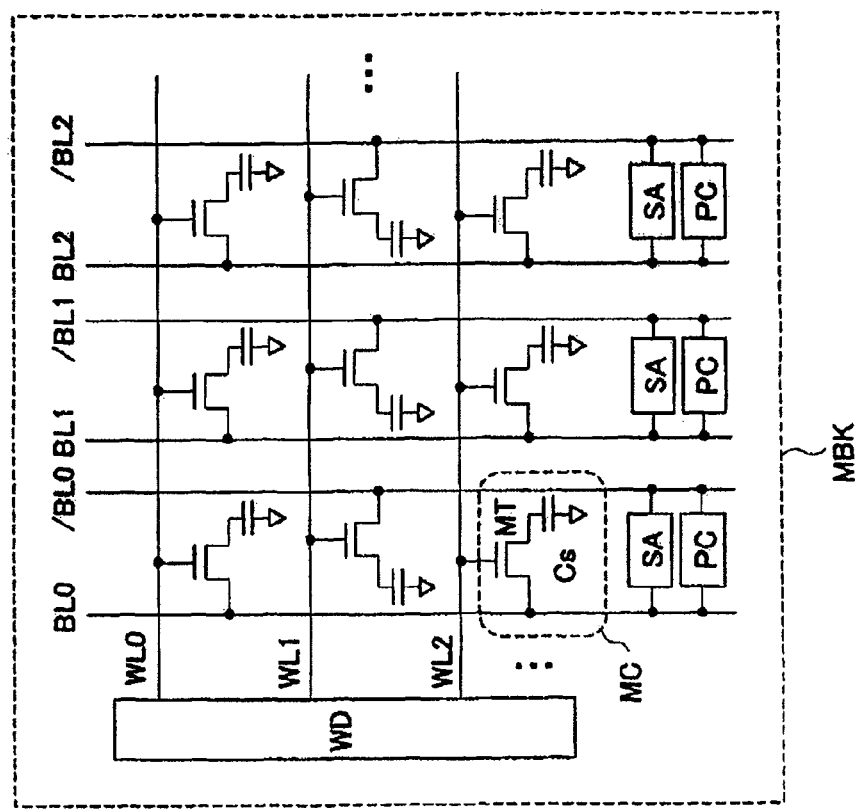
FIG. 4B is a circuit diagram showing an exemplary configuration of a memory bank shown in FIG. 4A.
Figure 4A:
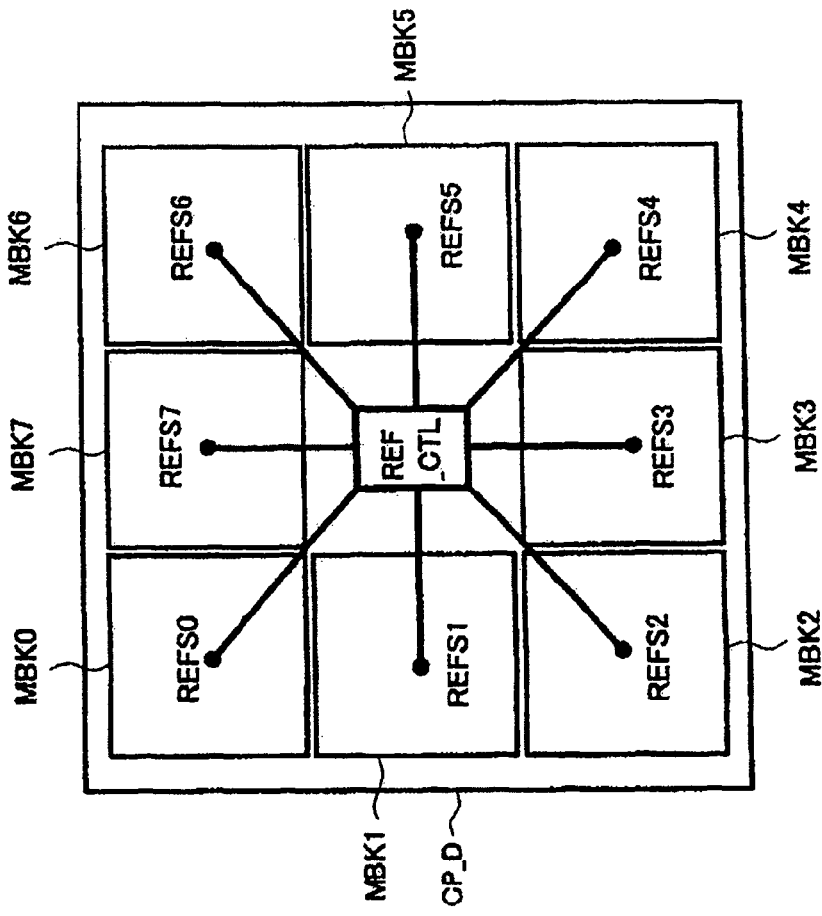
FIG. 4A is a block diagram showing an exemplary configuration of a semiconductor device according to a first embodiment.

FIG. 4A is a block diagram showing an exemplary configuration of a semiconductor device according to a first embodiment, and FIG. 4B is a circuit diagram showing an exemplary configuration of a memory bank shown in FIG. 4A.

Semiconductor device (semiconductor chip, semiconductor IC) CP_D shown in FIG. 4A is, for example, a DRAM chip which is formed on a single semiconductor chip. Semiconductor device CP_D comprises a plurality (here, eight) of memory banks MBK0-MBK7, and refresh control circuit REF_CTL.

Refresh control circuit REF_CTL outputs refresh signals REFS0-REFS7 to memory banks MBK0-MBK7, respectively, when it is applied with auto-refresh command REF from the outside, or when it internally generates auto-refresh command REF through a self-refresh operation, by way of example.

As shown in FIG. 4B, memory bank MBK0-MBK7 comprises a plurality of word lines WL0, WL1, . . . ; a plurality of bit line pairs (BL0, /BL0), (BL1, /BL1), . . . ; and a plurality of memory cells MC each positioned at the intersection of each word line with each bit line pair. Memory cell MC turns transistor MT on when corresponding word line WL is activated, to connect corresponding bit line BL to capacitance (capacitor) Cs.

Memory bank MBK comprises word driver circuit WD for driving word lines WL; a plurality of sense amp circuits SA for amplifying a potential difference of each bit line pair (BL, /BL); and a plurality of precharge circuits PC for precharging each bit line pair (BL, /BL).

Memory bank MBK (for example, MBK0), upon receipt of refresh signal REFS (for example, REFS0) from refresh control circuit REF_CTL, activates particular word line WL through word driver circuit WD. Word line WL to be activated is identified by a refresh address generator circuit (refresh counter circuit), not shown, included in refresh control circuit REF_CTL. After the lapse of a predetermined time required to recharge capacitor Cs, refresh control circuit REF_CTL forces word driver circuit WD to deactivate corresponding word line WL, and forces precharge circuit PC to precharge each bit line pair (BL, /BL).

Figure 5:
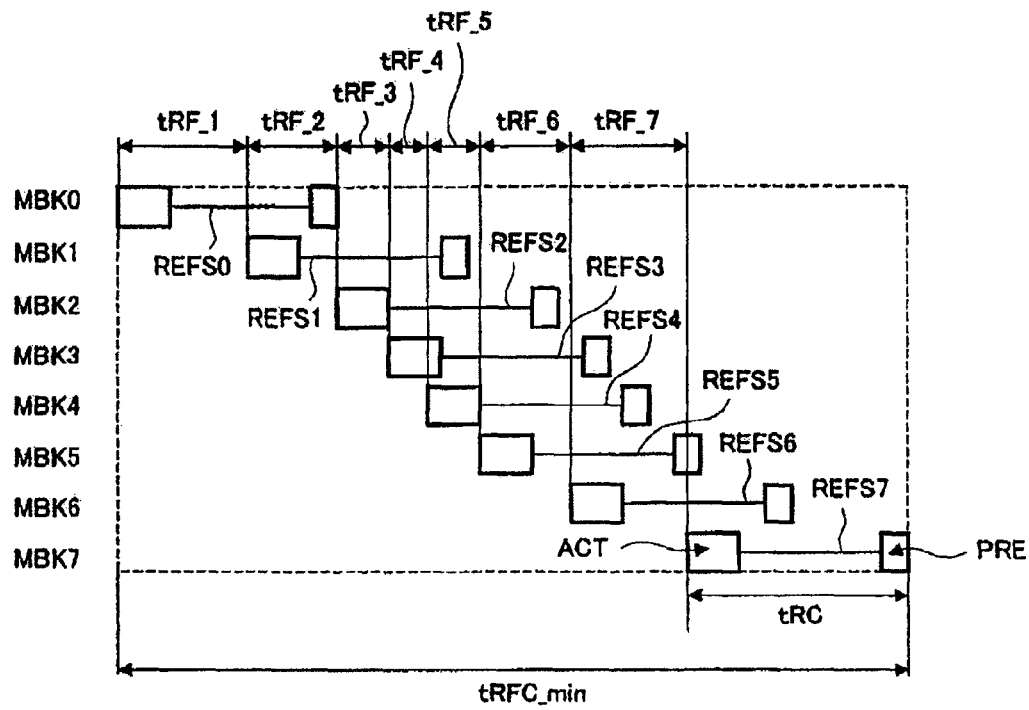
FIG. 5 is a schematic diagram showing an exemplary refresh operation in the semiconductor device shown in FIG. 4.

FIG. 5 is a schematic diagram showing an exemplary refresh operation of the semiconductor device shown in FIG. 4.

As shown in FIG. 5, in the semiconductor device of the first embodiment, refresh signals REFS0-REFS7 are sequentially supplied to memory bank MBK0 through memory bank MBK7 at timings different from one another. Refresh signal REFS includes an instruction for activating word line WL (ACT command) and an instruction for deactivating word line WL and precharging bit line BL (PRE command).

Here, define tRF_1 as representing a time difference between ACT commands applied to memory banks MBK0 and MBK1 (i.e., a time difference between start timings of refresh operations); tRF_2, a time difference between ACT commands applied to memory banks MBK1 and MBK2; tRF_3, a time difference between ACT commands applied to memory banks MBK2 and MBK3; tRF_4, a time difference between ACT commands applied to memory banks MBK3 and MBK4; tRF_5, a time difference between ACT commands applied to memory banks MBK4 and MBK5; tRF_6, a time difference between ACT commands applied to memory banks MBK5 and MBK6; and tRF_7, a time difference between ACT commands applied to memory banks MBK6 and MBK7.

Assume also that time tRC, from a time point when the ACT command is input to a time point when the PRE command is input is the same in memory banks MBK0-MBK7. Accordingly, the time difference between the PRE commands applied to memory banks MBK0 and MBK1 (i.e., a time difference in a timing at which a refresh operation ends) is the same as time difference tRF_1 between the ACT commands.

Similarly, the time difference between the PRE commands applied to memory banks MBK1 and MBK2 is the same as time difference tRF_2 between the ACT commands; the time difference between the PRE commands applied to memory banks MBK2 and MBK3 is the same as the time difference tRF_3 between the ACT commands; the time difference between the PRE commands applied to memory banks MBK3 and MBK4 is the same as the time difference tRF_4 between the ACT commands; the time difference between the PRE commands applied to memory banks MBK4 and MBK5 is the same as the time difference tRF_5 between the ACT commands; the time difference between the PRE commands applied to memory banks MBK5 and MBK6 is the same as the time difference tRF_6 between the ACT commands; and the time difference between the PRE commands applied to memory banks MBK6 and MBK7 is the same as the time difference tRF_7 between the ACT commands.

In the semiconductor device according to the first embodiment shown in FIG. 4, the start timing and the end timing of a refresh operation are set to satisfy the following equation (2):

$$(tRF\_1=tRF\_7)>(tRF\_2=tRF\_6)>(tRF\_3=tRF\_5)>tRF\_4 \quad (2)$$

Stated another way, Equation (2) indicates that T(I) is set to satisfy:

$$T(I)<T(I-1) \text{ when } T(I)=T(N-1) \text{ and } I\leq N/2,$$

where N represents the number of memory banks MBK, T(I) represents a time difference between a refresh operation for an Ith (I=1–N) MBK and a refresh operation for an (I+1)th memory bank MBK.

In this regard, period tRFC_min shown in FIG. 5 is a period which must be minimally ensured from the time when refresh signal REFS is issued to the first memory bank (i.e., a refresh operation is started in memory bank MBK0) to the time when a refresh operation is terminated in the last memory bank (i.e., MBK7), and is generally a value which is determined in the specifications. The values of tRF_1-tRF_7 must be set such that the refresh operation is terminated in all the memory banks within period tRFC_min and the condition of the aforementioned Equation (2) is satisfied.

FIG. 6A is a waveform chart showing an exemplary waveform of a current from a power supply during a refresh operation in a semiconductor device of a related art, and FIG. 6B shows a waveform chart of an exemplary waveform of a current from the power supply during a refresh operation of the semiconductor device shown in FIG. 5. FIG. 6C in turn is a waveform chart showing exemplary waveforms of voltages in the power supplies, corresponding to the current waveforms shown in FIGS. 6A and 6B, respectively. Specifically, FIG. 6A shows an exemplary waveform of a current from the power supply during a refresh operation of the related art shown in FIG. 1A.

As shown in FIG. 6A, during a refresh operation of the related art, the waveform of a current from the power supply system is substantially trapezoidal. On the other hand, in a refresh operation of the first embodiment shown in FIG. 5, the waveform of a current from the power supply system presents a half-cycle sinusoidal wave, as shown in FIG. 6B.

Consequently, as shown in FIG. 6C, the refresh operation of the related art involves a noise voltage of 390 mV at maximum, while the refresh operation shown in FIG. 5 involves a noise voltage of 260 mV even at maximum, which is a reduction by approximately 30%-40% of the noise voltage. This is because the current from the power supply system is shaped into the half-cycle sinusoidal wave, so that the amplitude of harmonic components is reduced.

As described above, generally, the impedance of a power supply system is mainly comprised of inductance (L), so that a current waveform having large harmonic components will generate a large noise voltage due to its inductance (L) component.

On the other hand, when the waveform of the current from the power supply system approximates to the half-cycle sinusoidal wave, the amplitude of the harmonic components is reduced, resulting in a reduction in the noise voltage of the power supply system. As such, the values of tRF_1-tRF_7 are preferably set such that the current from the power supply system is shaped into the half-cycle sinusoidal wave while the aforementioned Equation (2) is satisfied.

FIG. 7A is a circuit diagram showing an exemplary configuration of the refresh control circuit shown in FIG. 4, and FIG. 7B is a waveform chart showing an exemplary operation of the refresh control circuit shown in FIG. 7A.

Refresh control circuit REF_CTL1 shown in FIG. 7A comprises selector circuit SEL1; a plurality of flip-flop circuits FFn[m] (n, m are positive integers) connected in series; and a plurality of logic OR circuits OR10-OR17. Notably, the foregoing "n" is equivalent to the number of memory bank MBK, and is herein in the range of 0 to 7 (n=0-7). "M" in turn is equivalent to the number of a flip-flop circuit which is set in correspondence to memory bank MBKn, and is a value which is set as appropriate for each memory bank MBKn.

Selector circuit SEL1 selects one of two output nodes OT1, OT2 in accordance with selection signal S1, and outputs common refresh signal REFC input thereto from the selected output node. For reference, common refresh signal REFC is a signal for causing memory banks MBK-MBK7 to execute a refresh operation.

When selector circuit SEL1 selects output node OT1, common refresh signal REFC is input to one input terminal of each logic OR circuit OR10-OR17. In this event, memory banks MBK0-MBK7 are applied with refresh signals REFS0-REFS7 at substantially the same timing as common refresh signal REFC, shown in FIG. 7B.

Memory bank MBK0-MBK7 shown in FIG. 7A, when applied with refresh signal REFS0-REFS7, generates an ACT command at a rising edge of the refresh signal to activate a word line, and generates a PRE command at a falling edge of the refresh signal to precharge a bit line.

When selector circuit SEL1 selects output node OT2, common refresh signal REFC is input to flip-flop circuit FF0[0].

Flip-flop circuit FF0[0], FF1[0], FF1[1], FF1[2], FF2[0], FF2[1], . . . , FF7[2] latches an input signal in synchronization with, for example, a rising edge of clock signal CLK, and outputs a latch result. In this event, memory bank MBK0-MBK7 is applied with an output signal of flip-flop circuit FF0[0], FF1[2], FF2[1], ..., FF7[2] as refresh signal REFS0-REF7 through logic OR circuit OR10, OR11, OR12, ..., OR17 substantially in synchronization with a rising edge of clock signal CLK.

In the circuit shown in FIG. 7A, since flip-flop circuit FF0[0] is disposed between selector circuit SEL1 and logic OR circuit OR10, memory bank MBK0 is applied with refresh signal REFS0 which is delayed by a time equivalent to one cycle (Tf) of clock signal CLK at maximum with respect to common refresh signal REFC.

Also, in the circuit shown in FIG. 7A, since three flip-flop circuits FF1[0]-FF1[2] connected in series are disposed between logic OR circuit OR10 and logic OR circuit OR11, memory bank MBK1 is applied with refresh signal REFS1 which is delayed by a time equivalent to three cycles of clock signal CLK (tRF_1=3Tf) with respect to refresh signal REFS0.

Also, in the circuit shown in FIG. 7A, since two flip-flop circuits FF2[0]-FF2[1] connected in series are disposed between logic OR circuit OR11 and logic OR circuit OR12, memory bank MBK2 is applied with refresh signal REFS2 which is delayed by a time equivalent to two cycles of clock signal CLK (tRF_2=2Tf) with respect to refresh signal REFS1.

Similarly, memory bank MBK3-MBK7 is applied with refresh signal REFS which is delayed by a time equivalent to the frequency of clock signal CLK (mTf) which is equal to the number m of flip-flop circuits disposed between logic OR circuits at the preceding stage, with respect to refresh signal REFS input to the memory bank at the preceding stage.

In this embodiment, since tRF_1-tRF_7 are set to satisfy the aforementioned Equation (2), they are set, for example, as tRF_3=Tf, tRF_4=Tf, tRF_5=Tf, tRF_6=2Tf, tRF_7=3Tf when the circuit shown in FIG. 7A is employed.

For reference, period Tpd shown in FIG. 7B is the sum of a propagation delay time of flip-flop circuit FFn[m] with respect to clock signal CLK and a propagation delay time of logic OR circuit OR.

Refresh control circuit REF_CTL1 shown in FIG. 7A comprises a plurality of flip-flop circuits for sequentially shifting and outputting common refresh signal REFC in synchronization with clock signal CLK, and is configured to generate refresh signals REFS0-REFS7, which involve different time differences tRF, from the outputs of predetermined flip-flop circuits. With the use of refresh control circuit REF_CTL1 shown in FIG. 7A, the refresh operation can be readily implemented from one memory bank to another, shown in FIG. 5.

For example, when clock signal CLK has cycle Tf of approximately 10 ns, tRC shown in FIG. 5 is approximately 60 ns, and tRFC_min is approximately 120 ns, tRF_1 may be set to approximately 20 ns-30 ns by flip-flop circuits FF1[0]-FF1[2].

In this regard, FIG. 7A shows an exemplary configuration of refresh control circuit REF_CTL1 which comprises selector circuit SEL1 and logic OR circuits OR10-OR17 on the assumption that the refresh signals are simultaneously output to all memory banks MBK. Therefore, when the refresh signals need not be simultaneously output to all memory banks MBK, selector circuit SEL1 and logic OR circuits OR10-OR17, shown in FIG. 7A, may be omitted. In this event, refresh control circuit REF_CTL1 may be configured to deliver output signals of flip-flop circuits FF0[0], FF1[2], FF2[1], ..., FF7[2], as they are, to memory banks MBK0-MBK7, as refresh signals REFS0-REFS7.

Figures 8A, 8B:
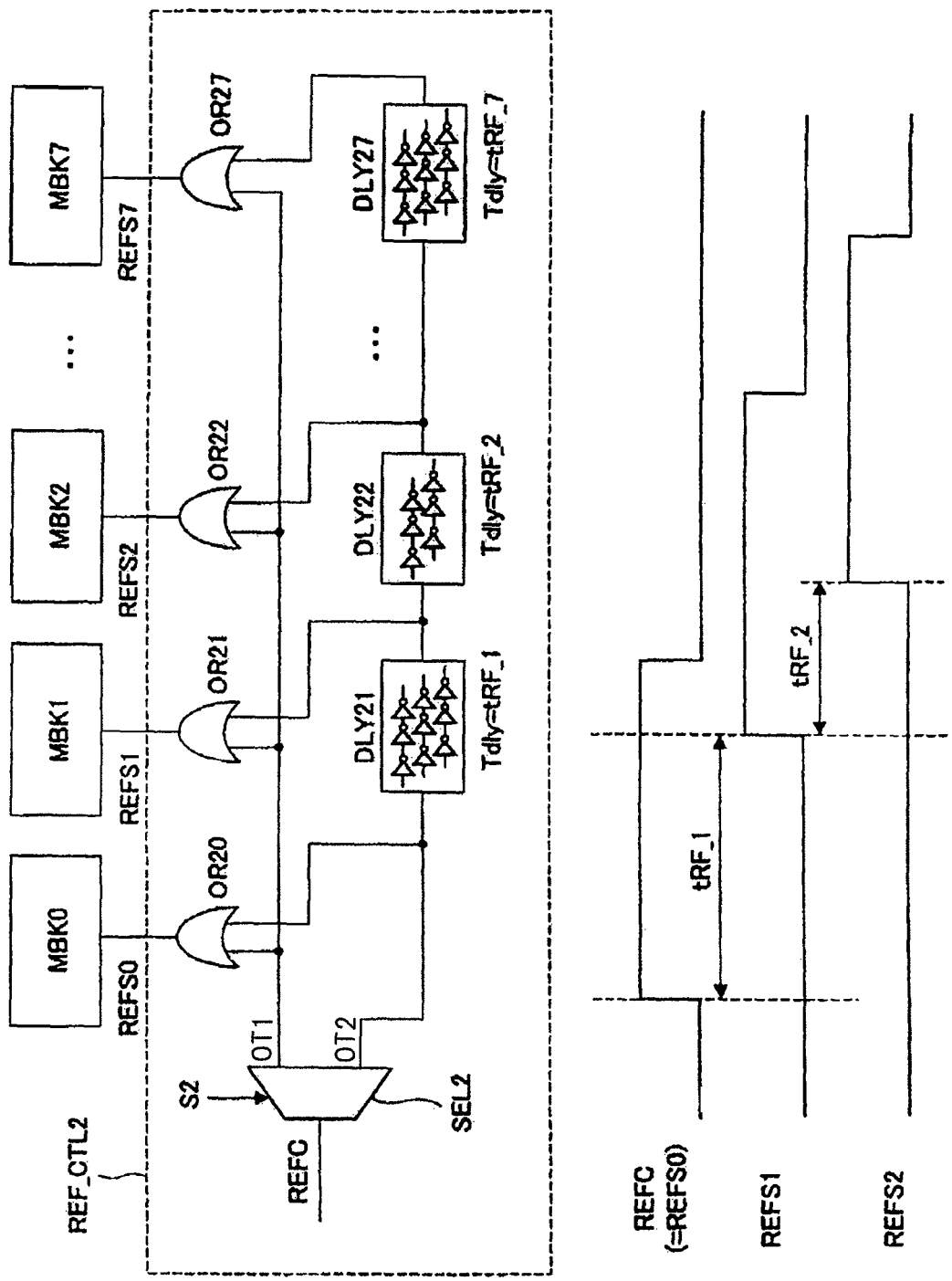
FIG. 8A is a circuit diagram showing another exemplary configuration of the refresh control circuit shown in FIG. 4.
FIG. 8B is a waveform chart showing an exemplary operation of the refresh control circuit shown in FIG. 8A.

FIG. 8A is a circuit diagram showing another exemplary configuration of the refresh control circuit shown in FIG. 4, and FIG. 8B is a waveform chart showing an exemplary operation of the refresh control circuit shown in FIG. 8A.

Refresh control circuit REF_CTL2 shown in FIG. 8A comprises selector circuit SEL2; a plurality of delay circuits DLY21-DLY27 connected in series; and a plurality of logic OR circuits OR20-OR27.

Selector circuit SEL2 selects one of two output nodes OT1, OT2 in accordance with selection signal S2, and outputs common refresh signal REFC input thereto from the selected output node.

When selector circuit SEL2 selects output node OT1, common refresh signal REFC is input to one input terminal of each logic OR circuit OR20-OR27. In this event, memory banks MBK0-MBK7 are applied with refresh signals REFS0-REFS7 at substantially the same timing as common refresh signal REFC shown in FIG. 8B.

Memory bank MBK0-MBK7 shown in FIG. 8A, when applied with refresh signal REFS0-REFS7, generates an ACT command at a rising edge of the refresh signal to activate a word line, and generates a PRE command at a falling edge of the refresh signal to precharge a bit line.

When selector circuit SEL2 selects output node OT2, common refresh signal REFC is input to delay circuit DLY21.

Delay circuit DLY21-DLY27 delays an input signal by a predetermined time, and outputs the delayed input signal. Since output node OT2 of selector circuit SEL2 and output terminals of delay circuits DLY21-DLY27 are connected to the other input terminals of logic OR circuits OR20-OR27, respectively, memory bank MBK0 is applied with an output signal from output node OT2 of selector circuit SEL2 through logic OR circuit OR20 as refresh signal REFS0, while memory bank MBK1-MBK7 is applied with an output signal of delay circuit DLY21-DLY27 through logic OR circuit OR21, OR22, OR27 as refresh signal REFS1-REFS7.

Delay times Tdly of delay circuits DLY21-DLY27 are set to tRF_1-tRF_7 shown in FIG. 5. In this way, as shown in FIG. 8B, logic OR circuit OR20 outputs refresh signal REFS0 at substantially the same timing as common refresh signal REFC; logic OR circuit OR21 outputs refresh signal REFS1 delayed by tRF_1 with respect to refresh signal REFS0; and logic OR circuit OR22 outputs refresh signal REFS2 delayed by tRF_2 with respect to refresh signal REFS1.

Though not shown in FIG. 8B, similarly, logic OR circuit OR23 outputs refresh signal REFS3 delayed by tRF_3 with respect to refresh signal REFS2; logic OR circuit OR24 outputs refresh signal REFS4 delayed by tRF_4 with respect to refresh signal REFS3; logic OR circuit OR25 outputs refresh signal REFS5 delayed by tRF_5 with respect to refresh signal REFS4; logic OR circuit OR26 outputs refresh signal REFS6 delayed by tRF_6 with respect to refresh signal REFS5; and logic OR circuit OR27 outputs refresh signal REFS7 delayed by tRF_7 with respect to refresh signal REFS6.

Delay circuits DLY21-DLY27 can be implemented, for example, by a plurality of inverters connected in series. In this event, delay time Tdly can be set by the number of inverters which are connected in series. With the use of refresh control circuit RFE_CTL2 shown in FIG. 8A, the refresh operation can be readily implemented for one memory bank to another, shown in FIG. 5.

Figure 9:
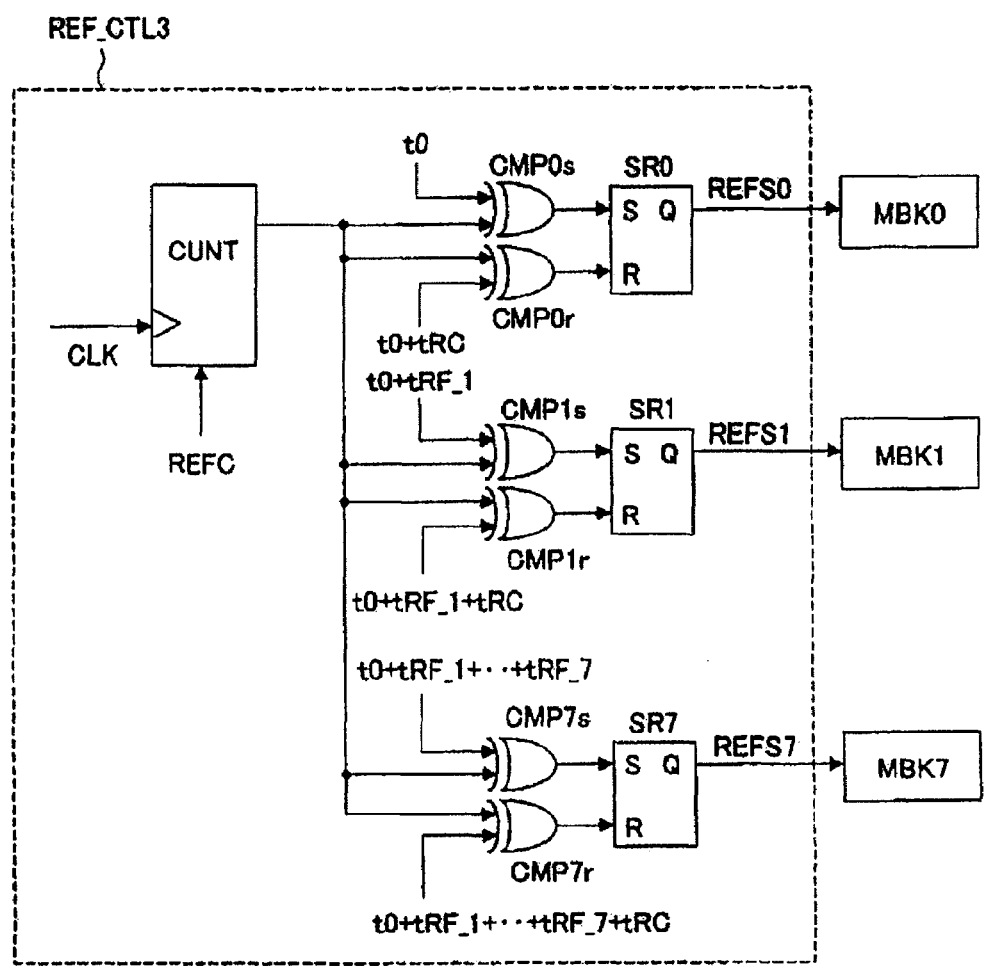
FIG. 9 is a circuit diagram showing another exemplary configuration of the refresh control circuit shown in FIG. 4.

FIG. 9 is a circuit diagram showing another exemplary configuration of the refresh control circuit shown in FIG. 4.

Refresh control circuit REF_CTL3 shown in FIG. 9 comprises counter circuit CUNT; comparators circuits (CMP0s, CMP0r)-(CMP7s, CMP7r); and SR flip-flop circuits SR0-SR7.

Counter circuit CUNT performs a count operation using clock signal CLK, the cycle of which is, for example, in the order of nanoseconds, and is triggered by common refresh signal REFC input thereto from the outside to start or reset the count operation.

Comparator circuit CMP0s sets SR flip-flop circuit SR0 when a count value output from counter circuit CUNT reaches preset threshold t0, and resets SR flip-flop circuit SR0 when the count value reaches threshold value t0+tRC. The output signal of SR flip-flop circuit SR0 is input to memory bank MBK0 as refresh signal REFS0.

Comparator circuit CMP1s in turn sets SR flip-flop circuit SR1 when the count value reaches threshold t0+tRF_1, while comparator circuit CMP1r resets SR flip-flop circuit SR1 when the count value reaches threshold t0+tRF_1+tRC. The output signal of SR flip-flop circuit SR1 is supplied to memory bank MBK1 as refresh signal REFS1.

Though not shown in FIG. 9, similarly, comparator circuit CMP2s sets SR flip-flop circuit SR2 when the count value reaches threshold t0+tRF_1+tRF_2, while comparator circuit CMP2r rests SR flip-flop circuit SR2 when the count value reaches threshold t0+tRF_1+tRF_2+tRC. An output signal of SR flip-flop circuit SR2 is supplied to memory bank MBK2 as refresh signal REFS2.

Comparator circuit CMP3s in turn sets SR flip-flop circuit SR3 when the count value reaches threshold t0+tRF_1+tRF_2+tRF_3, while comparator circuit CMP3r resets SR flip-flop circuit SR3 when the count value reaches threshold t0+tRF_1+tRF_2+tRF_3+tRC. The output signal of SR flip-flop circuit SR3 is supplied to memory bank MBK3 as refresh signal REFS3.

Comparator circuit CMP4s sets SR flip-flop circuit SR4 when the count value reaches threshold t0+tRF_1+tRF_2+tRF_3+tRF_4, while comparator circuit CMP4r resets SR flip-flop circuit SR4 when the count value reaches threshold t0+tRF_1+tRF_2+tRF_3+tRF_4+tRC. The output signal of SR flip-flop circuit SR4 is supplied to memory bank MBK4 as refresh signal REFS4.

Comparator circuit CMP5s sets SR flip-flop circuit SR5 when the count value reaches threshold t0+tRF_1+tRF_2+tRF_3+tRF_4+tRF_5, while comparator circuit CMP5r resets SR flip-flop circuit SR5 when the count value reaches threshold t0+tRF_1+tRF_2+tRF_3+tRF_4+tRF_5+tRC. An output signal of SR flip-flop circuit SR5 is supplied to memory bank MBK5 as refresh signal REFS5.

Comparator circuit CMP6s sets SR flip-flop circuit SR6 when the count value reaches threshold t0+tRF_1+tRF_2+tRF_3+tRF_4+tRF_5+tRF_6, while comparator circuit CMP6r resets SR flip-flop circuit SR6 when the count value reaches threshold t0+tRF_1+tRF_2+tRF_3+tRF_4+tRF_5+tRF_6+tRC. An output signal of SR flip-flop circuit SR6 is supplied to memory bank MBK6 as refresh signal REFS6.

Comparator circuit CMP7s sets SR flip-flop circuit SR7 when the count value reaches threshold t0+tRF_1+tRF_2+tRF_3+tRF_4+tRF_5+tRF_6+tRF_7, while comparator circuit CMP7r resets SR flip-flop circuit SR7 when the count value reaches threshold t0+tRF_1+tRF_2+tRF_3+tRF_4+tRF_5+tRF_6+tRF_7+tRC. An output signal of SR flip-flop circuit SR7 is supplied to memory bank MBK7 as refresh signal REFS7.

Likewise, refresh control circuit REF_CTL3 shown in FIG. 9 can readily implement the refresh operation for one memory bank to another, shown in FIG. 5. In this regard, when one wishes to set tRF_1-tRF_7 in time units shorter than the cycle of clock signal CLK in refresh control circuit REF_CTL3 shown in FIG. 9, delay circuits DLY21-DLY27 shown in FIG. 8 may be provided, for example, at the outputs of SR flip-flop circuits SR0-SR7.

According to the semiconductor device of the first embodiment, the waveform of the current from the power supply system approximates to the half-cycle sinusoidal wave to reduce harmonic components of the current which flows from the power supply system, so that the noise voltage can be reduced in the power supply system.

As appreciated, refresh control circuit REF_CTL of this embodiment is not limited to the configurations shown in FIGS. 7A, 8A, and 9, but may employ any circuit as long as it can set each tRF (tRF_1-tRF_7) shown in FIG. 5.

For example, refresh signals REFS0-REFS7 supplied to memory banks MBK0-MBK7 can be generated by a combination of a plurality of flip-flop circuits FFn[m] shown in FIG. 7A with delay circuit DLY shown in FIG. 8.

Also, the semiconductor device of the first embodiment has shown an example in which refresh signals REFS0-REFS7 are generated from common refresh signal REFC, and the ACT command and PRE command are generated from refresh signals REFS0-REFS7 within memory banks MBK0-MBK7, but memory banks MBK0-MBK7 are not limited to the configuration in which the ACT command and PRE command are generated from refresh signals REFS0-REFS7. When memory banks MBK0-MBK7 are configured not to internally generate the ACT command or PRE command, the ACT command and PRE command may be individually input to memory banks MBK0-MBK7 at timings shown in FIG. 5.

Second Embodiment

Figure 10:
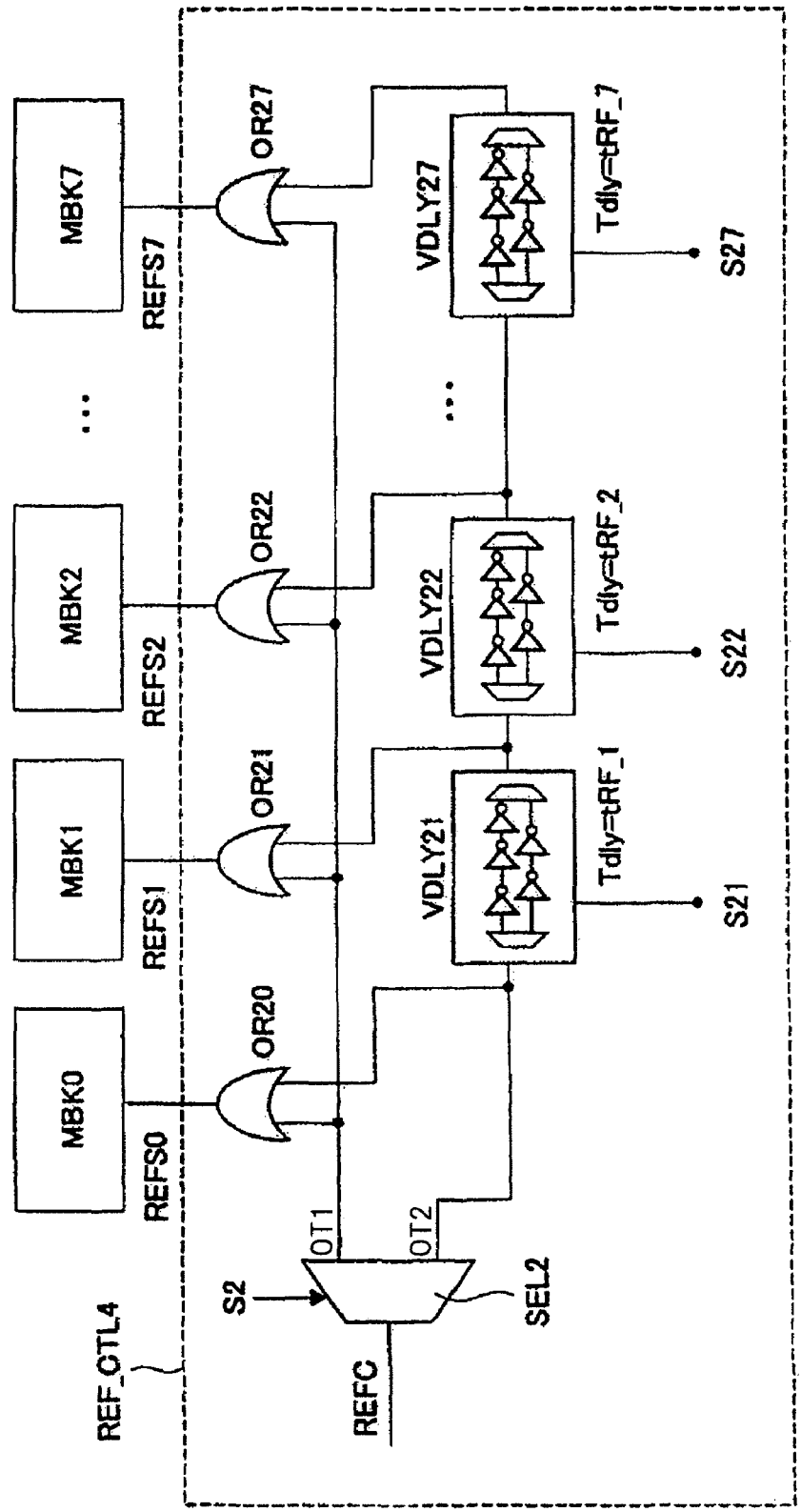
FIG. 10 is a circuit diagram showing an exemplary configuration of a refresh control circuit equipped in a semiconductor device according to a second embodiment.

FIG. 10 is a circuit diagram showing an exemplary configuration of a refresh control circuit equipped in a semiconductor device according to a second embodiment.

Refresh control circuit REF_CTL4 according to the second embodiment comprises variable delay circuits VDLY21-VDLY27 instead of delay circuits DLY21-DLY27 disposed in refresh control circuit REF_CTL2 shown in FIG. 8. The rest of the configuration and operation is similar to those of refresh control circuit REF_CTL2 shown in FIG. 8, so that a description thereon is omitted.

As shown in FIG. 10, variable delay circuit VDLY21-VDLY27 comprises, for example, a plurality of delay circuits which differ in delay time from one another, and is configured to select one of the plurality of delay circuits in accordance with selection signals S21-S27. While FIG. 10 shows an exemplary configuration which selects one of two delay circuits which differ in delay time, the number of delay circuits disposed in variable delay circuit VDLY21-VDLY27 need not be two, but any number of delay circuits may be disposed therein.

With the use of refresh control circuit REF_CTL4 comprising such variable delay circuits VDLY21-VDLY27, a current which flows from a power supply system of the semiconductor device can be modified in reference frequency and waveform. Consequently, the current waveform can be adjusted to approximate the half-cycle sinusoidal wave in accordance with the impedance characteristic of the power supply system, thus making it possible to more reduce a noise voltage in the power supply system.

According to the semiconductor device of the second embodiment, since the current waveform can be adjusted to approximate the half-cycle sinusoidal wave in accordance with impedance characteristics of a variety of power supply systems, noise voltages can be reduced in the power supply systems, in a manner similar to the first embodiment.

As can be appreciated, the refresh control circuit disposed in the semiconductor device of the second embodiment is not limited to the configuration shown in FIG. 10. For example, the refresh control circuit can employ a configuration which allows for a change to be made to the threshold which is supplied to comparator circuits CMP0s-CMP7s and CMP0r-CMP7r which make up refresh control circuit EF_CTL3 shown in FIG. 9. Additionally, variable delay circuit VDLY may employ any circuit as long as it can change a delay time for an output signal with respect to an input signal, and may therefore be configured using variable digital delay circuits and variable analog delay circuits in a variety of configurations, other than the circuit described in FIG. 10.

Third Embodiment

The first embodiment has shown an example in which timings of refresh operations in a plurality of DRAM chips are shifted as shown in FIG. 5 to shape the waveform of a current from the power supply system into the half-cycle sinusoidal wave. Such a method is not limited to the refresh operation of DRAM, but can be applied to a variety of circuits and devices.

Specifically, in a system where a plurality of circuit blocks operate within a predetermined period to supply a current from a power supply unit to each circuit block, the operation timing of each circuit block is shifted such that the waveform of the current from the power supply system approximates the half-cycle sinusoidal wave, whereby noise voltage can be reduced in the power supply system.

The third embodiment shows a variety of exemplary devices and systems to which the present invention can be applied.

Figure 11:
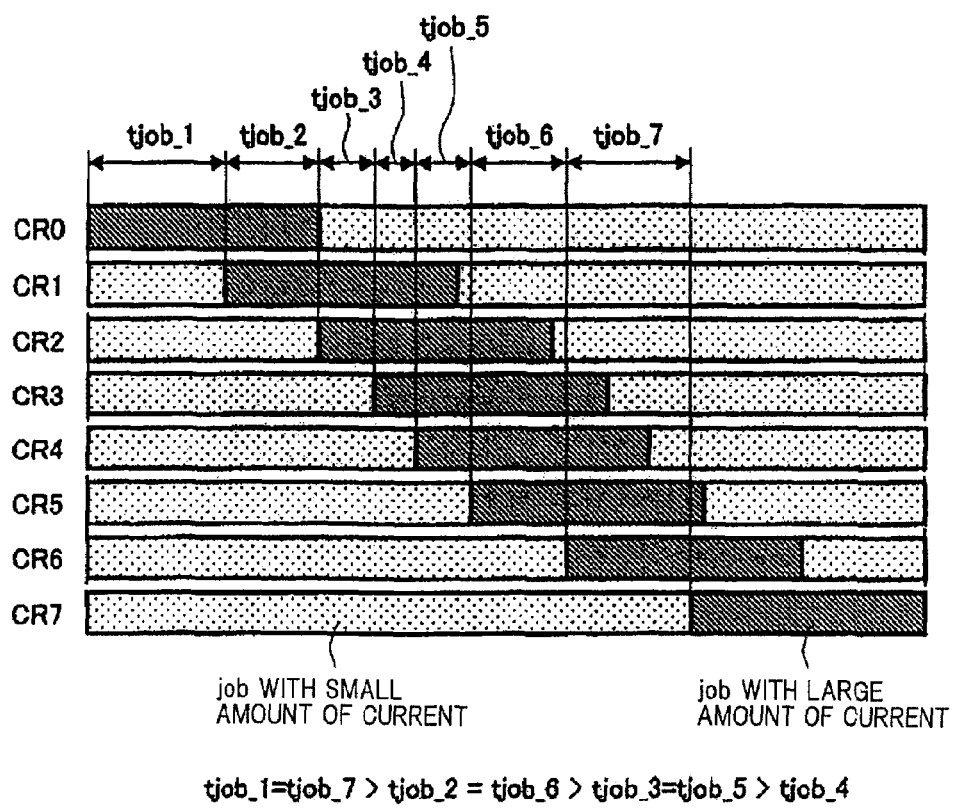
FIG. 11 is a schematic diagram showing the operation of a semiconductor device or an information processing system according to a third embodiment.

FIG. 11 is a schematic diagram showing the operation of a semiconductor device or an information processing system according to the third embodiment.

As shown in FIG. 11, the semiconductor device or information processing system according to the third embodiment is characterized by shifting operation timings of a plurality of circuit blocks (here, eight) CR0-CR7, as is the case with the semiconductor device according to the first embodiment.

Here, an operation contemplated for the application of the present invention is an operation which involves a relatively large current, as compared with other operations, which flows into a power supply system for a predetermined period (hereinafter called the "large-current operation") just like the aforementioned refresh operation in DRAM. In this regard, "other operations" include a state in which the current from the power supply system is reduced to almost zero, i.e., an inoperative state. Circuit blocks CR0-CR7 may be of the same type or different types. Also, the large-current operations of circuit blocks CR0-CR7 may be the same or different.

Define herein tjob_1 as representing a period from a start timing (and/or end timing) of a large-current operation in circuit block CR0 to a start timing (and/or end timing) of a large-current operation in circuit block CR1; tjob_2, a period from the start timing (and/or end timing) of the large-current operation in circuit block CR1 to a start timing (and/or end timing) of a large-current operation in circuit block CR2; tjob_3, a period from the start timing (and/or end timing) of the large-current operation in circuit block CR2 to a start timing (and/or end timing) of a large-current operation in circuit block CR3; tjob_4, a period from the start timing (and/or end timing) of the large-current operation in circuit block CR3 to a start timing (and/or end timing) of a large-current operation in circuit block CR4; tjob_5, a period from the start timing (and/or end timing) of the large-current operation in circuit block CR4 to a start timing (and/or end timing) of a large-current operation in circuit block CR5; tjob_6, a period from the start timing (and/or end timing) of the large-current operation in circuit block CR5 to a start timing (and/or end timing) of a large-current operation in circuit block CR6; and tjob_7, a period from the start timing (and/or end timing) of the large-current operation in circuit block CR6 to a start timing (and/or end timing) of a large-current operation in circuit block CR7. In this event, periods tjob_0-tjob_7 are set to satisfy a condition expressed by the following Equation (3) in the semiconductor device or information processing system of the third embodiment.

$$(tjob\_1 = tjob\_7) > (tjob\_2 = tjob\_6) > (tjob\_3 = tjob\_5) > tjob\_4 \quad (3)$$

Figure 12:
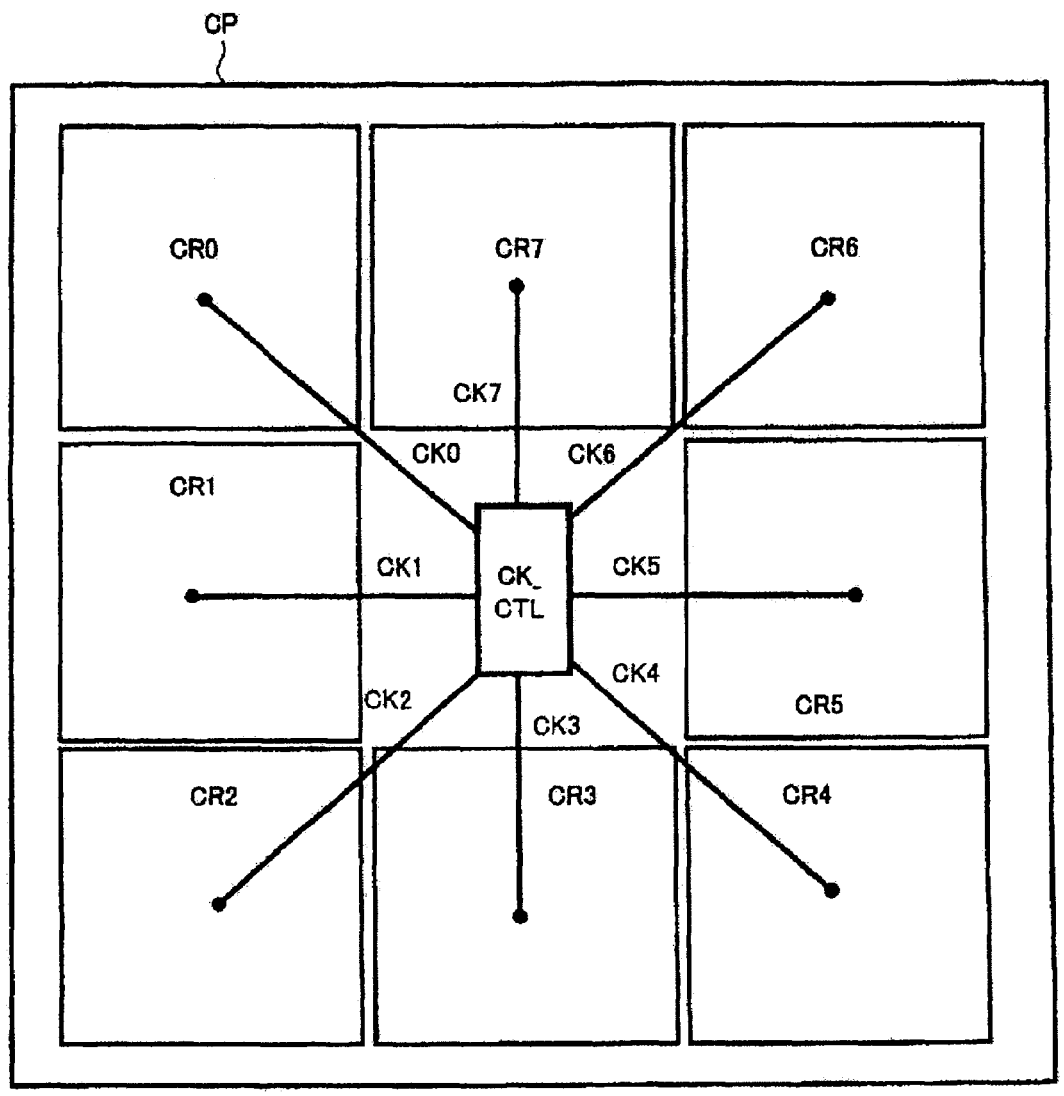
FIG. 12 is a block diagram showing an exemplary configuration of the semiconductor device according to the third embodiment.

FIG. 12 is a block diagram showing an exemplary configuration of the semiconductor device according to the third embodiment.

Semiconductor device CP shown in FIG. 12 comprises eight circuit blocks CR0-CR7 and clock signal control circuit CK_CTL in a single semiconductor chip. Circuit block CR0-CR7 may be, for example, a circuit which comprises a processor, though it is not limited in its functions. Clock signal control circuit CK_CTL supplies circuit blocks CR0-CR7 with clock signals CK0-CK7, and controls the operation of circuit blocks CR0-CR7. When circuit block CR0-CR7 comprises a processor, semiconductor device CP shown in FIG. 12 acts as a multi-processor system.

Clock signal control circuit CK_CTL supplies clock signals CK0-CK7 at a relatively low frequency to circuit blocks CR0-CR7 when semiconductor device CP is required to operate at low speeds in order to reduce power consumption, and supplies clock signals CK0-CK7 at a relatively high frequency to circuit blocks CR0-CR7 when high-speed processing is required, for example, in accordance with scheduling implemented by software or hardware.

Here, clock signal control circuit CK_CTL transitions circuit blocks CR0-CR7, for example, from low-speed processing to high-speed processing at different timings, as shown in FIG. 11. In this way, noise voltage can be reduced in the power supply system.

Figure 13:
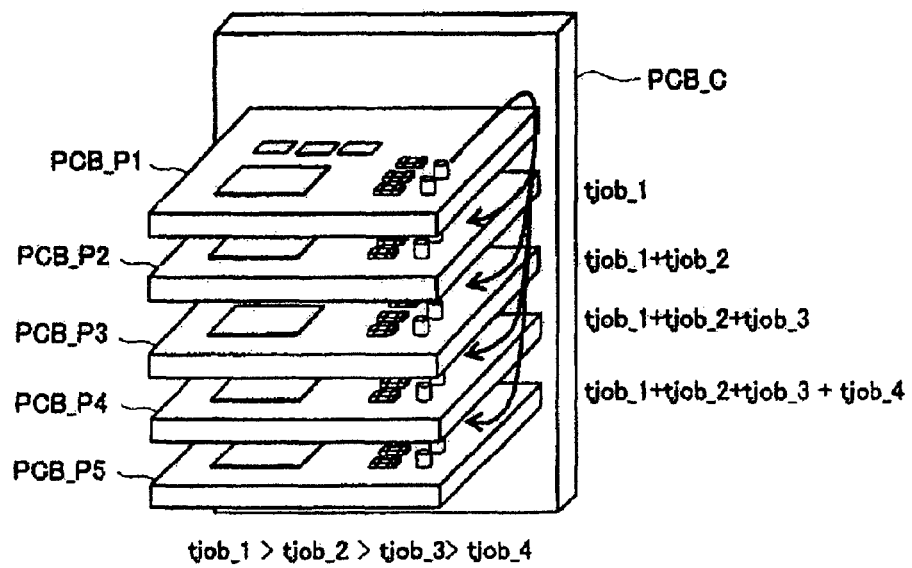
FIG. 13 is a perspective view showing an exemplary configuration of the information processing system according to the third embodiment.

FIG. 13 is a perspective view showing an exemplary configuration of an information processing system according to the third embodiment.

The information processing system shown in FIG. 13 comprises a plurality (here, five) of processor boards (wiring boards) PCB_P1-PCB_P5 which are connected to control board (wiring board) PCB_C. The information processing system shown in FIG. 13 operates as a multi-processor system through parallel operations of respective circuits formed on processor boards PCB_P1-PCB_P5.

In such an information processing system, noise voltages can be reduced in power supply systems by starting processing executed on the respective processor boards, which involves a relatively large current from the power supply system, at different timings as shown in FIG. 11.

Figure 14:
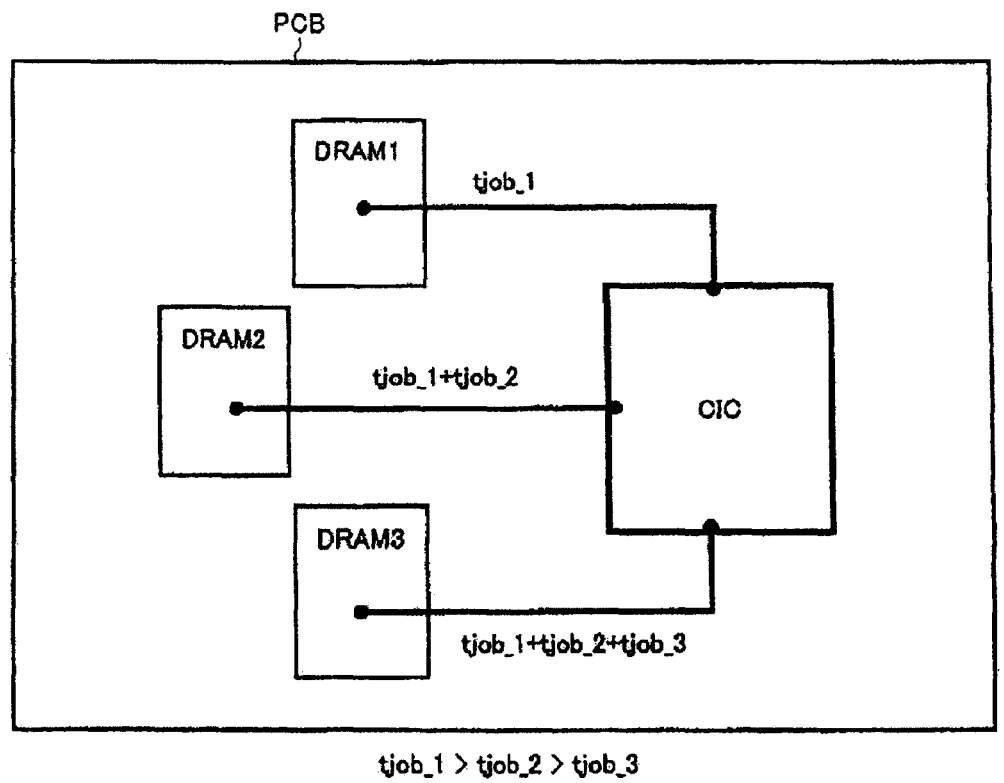
FIG. 14 is a block diagram showing another exemplary configuration of the information processing system according to the third embodiment.
Figure 15:
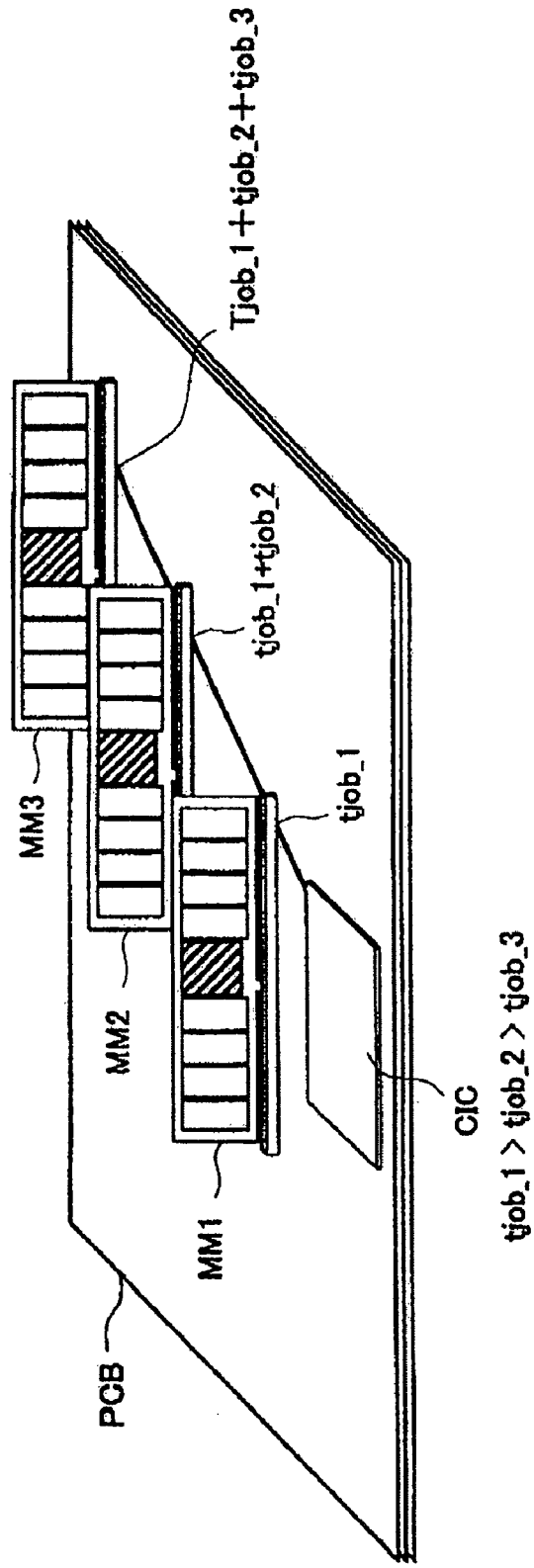
FIG. 15 is a perspective view showing another exemplary configuration of the information processing system according to the third embodiment.

FIG. 14 is a block diagram showing another exemplary configuration of the information processing system according to the third embodiment, and FIG. 15 is a perspective view showing another exemplary configuration of the information processing system according to the third embodiment.

The information processing system shown in FIG. 14 comprises a plurality (here, three) of DRAM-ICs (DRAM1-DRAM3) and control IC (memory controller IC) CIC for controlling the operation of the DRAM-ICs, which are mounted on wiring board (for example, mother board) PCB.

The information processing system shown in FIG. 15 comprises a plurality (here, three) of DRAM modules MM1-MM3 and control IC (memory control IC) CIC for controlling the operation of the DRAM modules, which are mounted on wiring board (for example, mother board) PCB.

In the information processing system shown in FIG. 14, the control IC (CIC) sets auto-refresh command REF output to each DRAM-IC (DRAM1-DRAM3) at different timings as shown in FIG. 11. In this way, DRAM1-DRAM3 perform refresh operations at different timings from one another.

On the other hand, in the information processing system shown in FIG. 15, the control IC (CIC) sets auto-refresh command REF output to each DRAM module MM1-MM3 at different timings as shown in FIG. 11. In this way, DRAM modules MM1-MM3 perform refresh operations at different timings from one another. In other words, in these systems, the control IC (CIC) comprises the circuits previously shown in FIGS. 7-9. In this way, the information processing systems shown in FIGS. 14 and 15 can reduce noise voltages in power supply systems.

Figure 16:
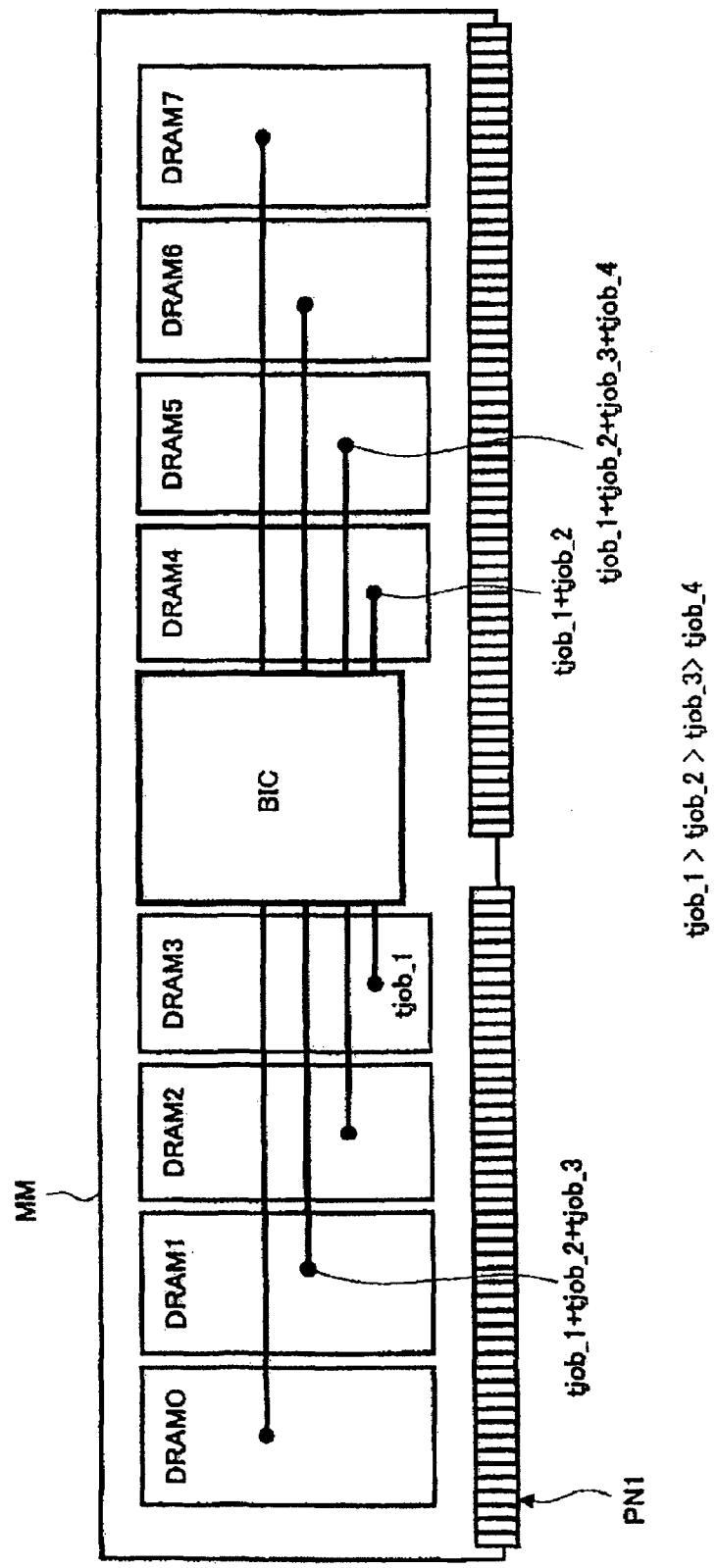
FIG. 16 is a plan view showing a yet further exemplary configuration of the semiconductor device according to the third embodiment.

FIG. 16 is a plan view showing a yet further exemplary configuration of the semiconductor device according to the third embodiment.

The semiconductor device shown in FIG. 16 is DRAM module MM which comprises, for example, eight DRAM-ICs (DRAM0-DRAM7), and a buffer IC (BIC) for buffering a signal from external terminal PN1 to output the signal to each DRAM-IC.

In the semiconductor device shown in FIG. 16, the buffer IC (BIC) for receiving a signal input from external terminal PN1 determines whether or not the input signal is auto-refresh command REF, and, when it is auto-refresh command REF, outputs the command to the respective DRAM-ICs at different timings. In other words, in the semiconductor device shown in FIG. 16, the buffer IC (BIC) comprises the circuits shown in FIGS. 7-9. In this way, the semiconductor device shown in FIG. 16 can reduce noise voltage in a power supply system.

Figure 17:
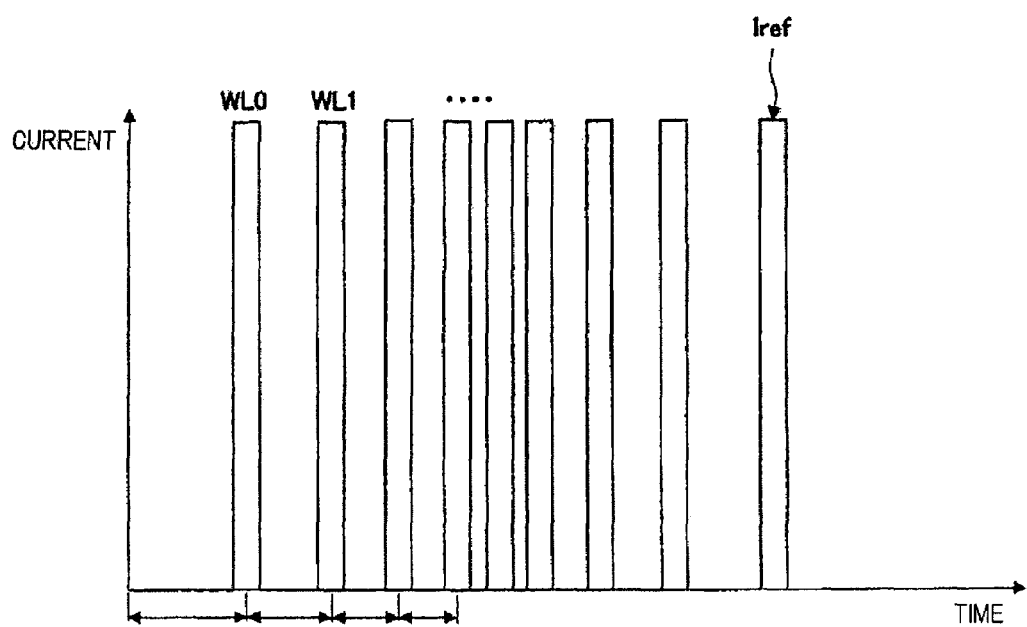
FIG. 17 is a schematic diagram showing another exemplary operation of the semiconductor device according to the third embodiment.

FIG. 17 is a schematic diagram showing another exemplary operation of the semiconductor device according to the third embodiment.

The exemplary operation shown in FIG. 17 is characterized in that respective word lines WL are sequentially activated within a memory bank at different intervals from one another in an intensive refresh operation, for example, by semiconductor device CP_D shown in FIGS. 4A and 4B. Specifically, the widest interval tACT is present between the activation of word line WL0 and the activation of word line WL1, the intervals between the activations becomes gradually narrower as the activation progresses to word lines WL2, WL3, and so on, and the intervals between the activations are gradually widened, on the contrary, after a certain word line has been activated.

By setting the operation timings as shown in FIG. 17, a current flowing from a power supply system of the semiconductor device can be shaped into the half-cycle sinusoidal wave so that harmonic components thereof can be reduced, thus making it possible to reduce noise voltage in the power supply system.

Figure 18:
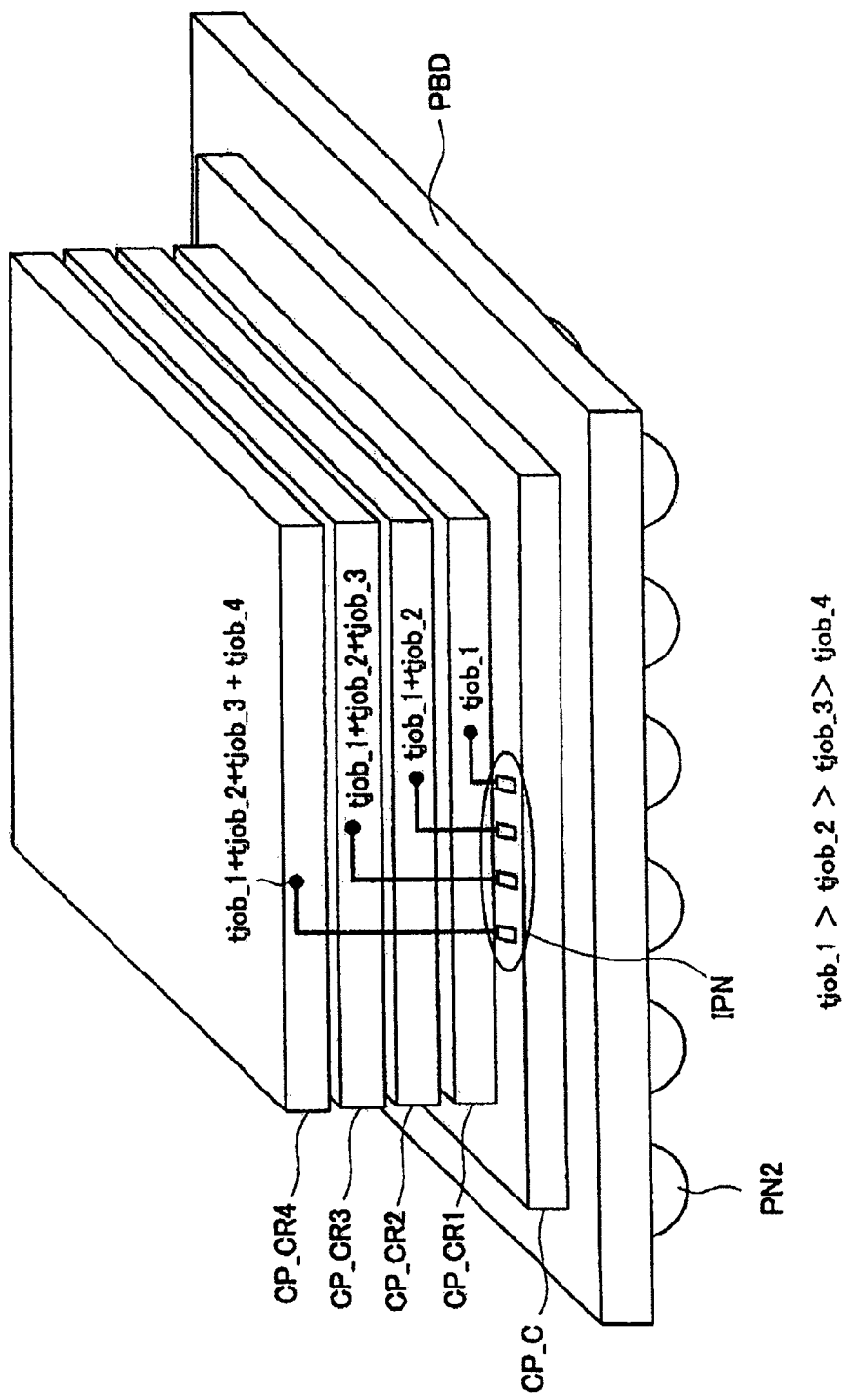
FIG. 18 is a perspective view showing a yet further exemplary configuration of the semiconductor device according to the third embodiment.

FIG. 18 is a perspective view showing a yet further exemplary configuration of the semiconductor device according to the third embodiment of the present invention.

The semiconductor device shown in FIG. 18 comprises control semiconductor chip CP_C and a plurality (here, four) of processing semiconductor chips CP_CR1-CP_CR4 laminated on package board (wiring board) PBD which comprises external terminal PN2. Processing semiconductor chips CP_CR1-CP_CR4 are, for example, processor chips, DRAM chips and the like.

Control semiconductor chip CP_C comprises internal terminal IPN, and controls the operation of processing semiconductor chips CP_CR1-CP_CR4 by transmitting commands and the like through internal terminal IPN. Internal terminal IPN is, for example, analogous to a terminal for outputting a clock signal, as is the case with the semiconductor device shown in FIG. 12, a terminal for outputting a refresh signal, as is the case with the information processing system shown in FIG. 14, or the like.

Figure 19A:
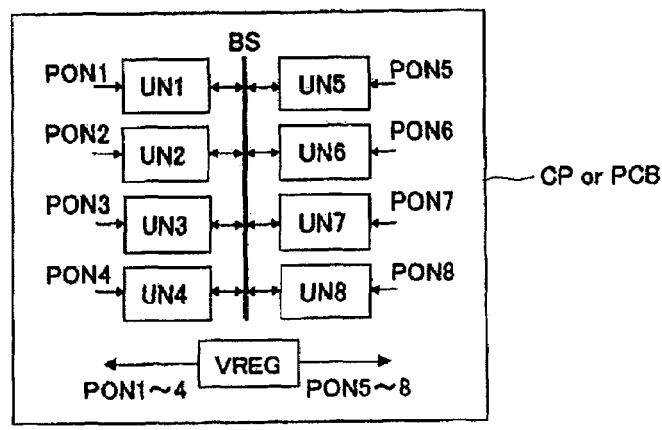
FIG. 19A is a block diagram showing a yet further exemplary configuration of the semiconductor device or information processing system according to the third embodiment.
Figure 19B:
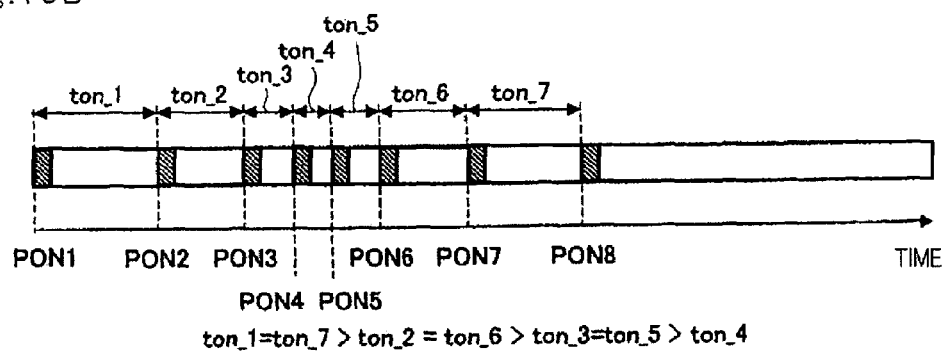
FIG. 19B is a schematic diagram showing the operation of the semiconductor device or information processing system shown in FIG. 19A.

FIG. 19A is a block diagram showing a yet further exemplary configuration of the semiconductor device or information processing system according to the third embodiment, and FIG. 19B is a schematic diagram showing the operation of the semiconductor device or information processing system shown in FIG. 19A.

The semiconductor device or information processing system shown in FIG. 19A comprises a plurality (here, eight) of processing units UN1-UN8 connected to bus BS, and regulator unit VREG.

Processing units UN1-UN8 and regulator unit VREG are formed, for example, on a single semiconductor chip CP, or formed on individual semiconductor chips (i.e., discrete ICs), respectively, and mounted on wiring board PCB. Regulator unit VREG supplies predetermined supply voltages PON1-PON8 to processing units UN1-UN8.

In the semiconductor device or information processing system shown in FIG. 19A, upon starting the supply of the supply voltages to processing units UN1-UN8, regulator unit VREG conducts control to shift power supply start timings, rather than simultaneously supplying the power to processing units UN1-UN8, such that a current flowing from a power supply system is shaped into the half-cycle sinusoidal wave.

For example, a microcomputer or the like may involve such operations as temporarily interrupting and resuming a power supply to a certain internal module (processing unit) in order to reduce power consumption.

In the semiconductor device or information processing system shown in FIG. 19A, the power supply start timings are shifted as shown in FIG. 19B when all the internal modules (processing units) are supplied with power, or a power supply is resumed for some of the internal modules (processing units). A noise voltage can be reduced in a power supply system by controlling the power supply start timing in this way.

Fourth Embodiment

A fourth embodiment proposes an exemplary modification to the exemplary operation of the third embodiment shown in FIG. 11.

Figure 20B:
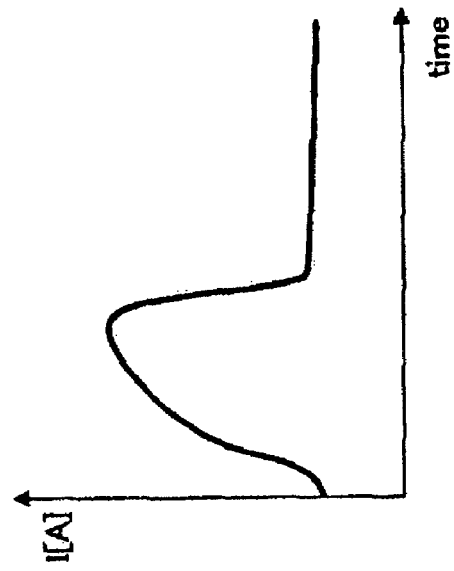
FIG. 20B is a waveform chart showing an exemplary waveform of a current which flows in a power supply system in the exemplary operation shown in FIG. 20A.
Figure 20A:
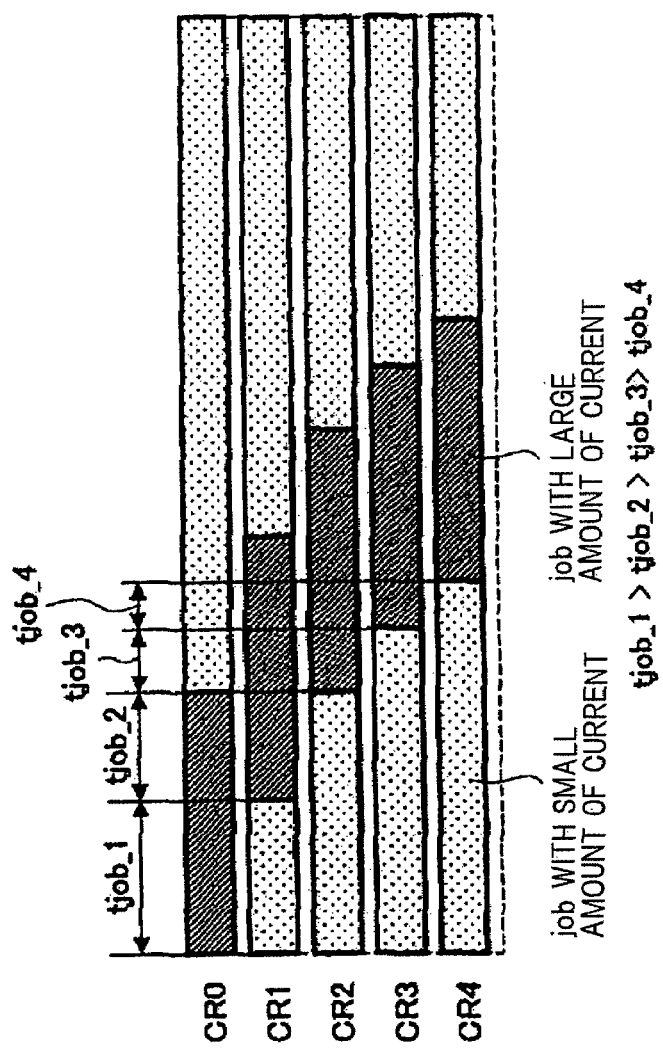
FIG. 20A is a schematic diagram showing an exemplary operation of a semiconductor device or an information processing system according to a fourth embodiment.

FIG. 20A is a schematic diagram showing an exemplary operation of a semiconductor device or an information processing system according to the fourth embodiment, and FIG. 20B is a waveform chart showing an exemplary waveform of a current which flows in a power supply system in the exemplary operation shown in FIG. 20A.

As described above, in the first through third embodiments, the timings of the large-current operations are shifted for the respective circuit blocks, which form part of the semiconductor device or information processing system, such that the waveform of the current from the power supply system is shaped into the shape of a half cycle of a sinusoidal wave (half-cycle sinusoidal wave).

The fourth embodiment provides an example in which the timings of the large-current operations are shifted for the respective circuit blocks, which form part of the semiconductor device or information processing system, such that the waveform of the current from the power supply system is shaped into the shape of one-quarter cycle of a sinusoidal wave (quarter-cycle sinusoidal wave).

Here, the semiconductor device or information processing system comprises five circuit blocks CR0-CR4, where tjob_1 represents a period from a start timing (and/or end timing) of a large-current operation in circuit block CR0 to a start timing (and/or end timing) of a large-current operation in circuit block CR1; tjob_2, a period from the start timing (and/or end timing) of the large-current operation in circuit block CR1 to a start timing (and/or end timing) of a large-current operation in circuit block CR2; tjob_3, a period from the start timing (and/or end timing) of the large-current operation in circuit block CR2 to a start timing (and/or end timing) of a large-current operation in circuit block CR3; tjob_4, a period from the start timing (and/or end timing) of the large-current operation in circuit block CR3 to a start timing (and/or end timing) of a large-current operation in circuit block CR4; and tjob_5, a period from the start timing (and/or end timing) of the large-current operation in circuit block CR4 to a start timing (and/or end timing) of a large-current operation in circuit block CR5. In this event, in the semiconductor device or information processing system according to the fourth embodiment, periods tjob_0-tjob_7 are set to satisfy a condition expressed by the following Equation (4):

$$\text{tjob\_1} > \text{tjob\_2} > \text{tjob\_3} > \text{tjob\_4} \quad (4)$$

By shifting the timings of the large-current operations in circuit blocks CR0-CR4 under such a condition, the current which flows from the power supply system can be shaped into the quarter-cycle sinusoidal wave, as shown in FIG. 20B. However, with such a current waveform, harmonic components will occur at falling edges of the current, as compared with the semiconductor devices and information processing systems shown in the first through third embodiments. However, the semiconductor device and information processing system according to the fourth embodiment can reduce the noise voltage in the power supply system, as compared with the semiconductor device and information processing system of the related art.

While the invention made by the inventors has been specifically described in connection with the respective embodiments described above, the present invention is not limited to the foregoing embodiments but can be modified in various manners without departing from the spirit thereof.

While the semiconductor device and information processing system of the embodiments are particularly suitable for applications to products including DRAM, such as DRAM-IC, DRAM module, board mounted with DRAM and the like, the present invention is not so limited but can be widely applied to semiconductor devices such as a processor and a microprocessor, and general information processing systems which are mounted with a variety of semiconductor parts.

What is claimed is:

1. A semiconductor device comprising:
    a plurality of circuit blocks; and
    a control circuit controlling a start timing of a large-current operation performed by each of said plurality of circuit blocks within a predetermined period, said large-current operation involving a relatively large current flowing from a power supply system as compared with other operations,
    wherein said control circuit controls a start timing for the large-current operation of each circuit block such that the waveform of the current flowing from said power supply system is shaped into a waveform of a half cycle of a sinusoidal wave, when said plurality of circuit blocks execute the large-current operations within the predetermined period.

2. The semiconductor device according to claim 1, wherein a time interval T(I) between the large-current operations executed at an I-th time and an (I+1)th time satisfies:

$$T(I) = T(N-I); \text{ and}$$

$$T(I) < T(I-1) \text{ when I is equal to or less than N/2,}$$

where N represents the number of circuit blocks which execute the large-current operation.

3. The semiconductor device according to claim 1, wherein said large-current operations performed by said plurality of circuit blocks are the same operations.

4. The semiconductor device according to claim 1, wherein said plurality of circuit blocks and said control circuit are mounted on the same semiconductor chip.

5. The semiconductor device according to claim 1, wherein said plurality of circuit blocks and said control circuit are formed on a plurality of semiconductor chips, and said plurality of semiconductor chips are mounted on the same semiconductor chip.

6. The semiconductor device according to claim 1, wherein:
    said plurality of circuit blocks comprise a DRAM including a plurality of memory banks formed on the same semiconductor chip, and
    said large-current operation executed by said plurality of memory banks is a refresh operation.

7. The semiconductor device according to claim 1, wherein:
    said plurality of circuit blocks are DRAM chips mounted on the same wiring board,
    said large-current operation executed by said plurality of DRAM chips is a refresh operation, and
    said control circuit is implemented in a buffer ID mounted on said wiring board.

8. An information processing system comprising:
    a plurality of semiconductor devices; and
    a control device controlling a start timing of a large-current operation performed by each of said plurality of semiconductor devices within a predetermined period, said large-current operation involving a relatively large current flowing from a power supply system as compared with other operations,
    wherein said control device controls a start timing for the large-current operation of each semiconductor device such that the waveform of the current flowing from said power supply system is shaped into a waveform of a half cycle of a sinusoidal wave, when said plurality of semiconductor devices execute the large-current operations within the predetermined period.

9. The information processing system according to claim 8, wherein a time interval T(I) between the large-current operations executed at an I-th time and an (I+1)th time satisfies:

$$T(I) = T(N-I); \text{ and}$$

$$T(I) < T(I-1) \text{ when } I \text{ is equal to or less than } N/2,$$

where N represents the number of semiconductor devices which execute the large-current operations.

10. The information processing device according to claim 8, wherein said plurality of semiconductor devices and said control device are mounted on the same wiring board.

11. The information processing system according to claim 8, wherein:
said plurality of semiconductor devices are DRAM chips mounted on the same wiring board, and
said large-current operation executed by said plurality of DRAM chips is a refresh operation.

12. The information processing system according to claim 8, wherein:
said plurality of semiconductor devices are DRAM modules mounted on the same wiring board, and
said large-current operation executed by said plurality of DRAM modules is a refresh operation.

13. A semiconductor device comprising:
a plurality of memory banks each comprising a plurality of word lines, a plurality of bit lines, and a plurality of DRAM memory cells disposed at intersections of said plurality of word lines with said plurality of bit lines; and
a refresh control circuit controlling refresh operations of said plurality of memory banks,
wherein said plurality of memory banks, responsive to a refresh signal input thereto, activate/deactivate predetermined word lines, and
said refresh control circuit, responsive to a common refresh signal for causing said plurality of memory banks to execute refresh operations, generates the refresh signal to said plurality of memory banks at different timings, and outputs the generated refresh signal to said plurality of memory banks such that the waveform of a current flowing from a power supply system is shaped into a waveform of a half cycle of a sinusoidal wave.

14. The semiconductor device according to claim 13, wherein:
a time interval T(I) between the refresh operations executed at an I-th time and an (I+1)th time satisfies:

$T(I)=T(N-I)$; and $T(I)<T(I-1)$ when $I$ is equal to or less than $N/2$, where N represents the number of memory banks which execute the refresh operations.

15. The semiconductor device according to claim 14, wherein:
said refresh control circuit comprises a plurality of delay circuits connected in series for sequentially delaying an input signal, and
said time interval T(I) is set as represented by a delay time of said plurality of delay circuits.

16. The semiconductor device according to claim 15, wherein:
said delay circuit comprises a plurality of flip-flop circuits connected in series for sequentially shifting and outputting an input signal in synchronization with a clock signal, and
said time interval T(I) is set as represented by the number of said flip-flop circuits connected in series, and/or a propagation delay time of said flip-flop circuits.

17. The semiconductor device according to claim 13, wherein said refresh control circuit comprises a plurality of variable delay circuits, each capable of varying a delay time, connected in series for sequentially delaying an input signal.

* * * * *